United States Patent
Hsiao et al.

(10) Patent No.: US 9,806,145 B2
(45) Date of Patent: Oct. 31, 2017

(54) PASSIVE CHIP DEVICE AND METHOD OF MAKING THE SAME

(71) Applicant: Wafer Mems Co., Ltd., Miaoli County (TW)

(72) Inventors: Min-Ho Hsiao, Miaoli County (TW); Pang-Yen Lee, Miaoli County (TW); Yen-Hao Tseng, Miaoli County (TW)

(73) Assignee: WAFER MEMS CO., LTD., Jhunan, Miaoli (TW)

( * ) Notice: Subject to any disclaimer, the term of this patent is extended or adjusted under 35 U.S.C. 154(b) by 0 days.

(21) Appl. No.: 15/152,882

(22) Filed: May 12, 2016

(65) Prior Publication Data

US 2016/0380042 A1    Dec. 29, 2016

(30) Foreign Application Priority Data

Jun. 25, 2015 (TW) .............................. 104120533 A

(51) Int. Cl.
| | |
|---|---|
| *H01L 21/326* | (2006.01) |
| *H01L 49/02* | (2006.01) |
| *H01L 21/768* | (2006.01) |
| *H01F 41/04* | (2006.01) |
| *H01L 23/64* | (2006.01) |

(52) U.S. Cl.
CPC ............. *H01L 28/10* (2013.01); *H01F 41/04* (2013.01); *H01L 21/76871* (2013.01); *H01L 23/645* (2013.01)

(58) Field of Classification Search
CPC .......................... H01L 28/10; H01L 21/76871
USPC .......................................... 438/467; 257/531
See application file for complete search history.

(56) References Cited

U.S. PATENT DOCUMENTS

| | | | | |
|---|---|---|---|---|
| 9,171,794 | B2 * | 10/2015 | Rafferty | .............. H01L 23/4985 |
| 9,318,455 | B2 * | 4/2016 | Lin | ......................... H01L 24/11 |
| 2013/0134581 | A1 * | 5/2013 | Lin | ....................... H01L 21/563 |
| | | | | 257/737 |
| 2016/0276173 | A1 * | 9/2016 | Song | ................. H01L 23/49816 |
| 2016/0379748 | A1 * | 12/2016 | Hsiao | ................. H01F 17/0006 |
| | | | | 336/200 |

(Continued)

FOREIGN PATENT DOCUMENTS

| | | |
|---|---|---|
| TW | 507220 | 10/2002 |
| TW | I234172 | 6/2005 |

(Continued)

OTHER PUBLICATIONS

Taiwanese Search Report with English Language Translation dated Jun. 25, 2015, Taiwanese Application No. 104120533.

*Primary Examiner* — Jami M Valentine
(74) *Attorney, Agent, or Firm* — Blakely Sokoloff Taylor & Zafman LLP

(57) ABSTRACT

A passive chip device includes a chip body, a conductive coil and a surface-mount contact unit. The chip body is in the form of a single piece, and has two opposite end faces and a first surface which is between the end faces. The conductive coil is deposited on and surrounding the chip body. The surface-mount contact unit includes two spaced apart conductive terminal contacts. Each of the terminal contacts extends from a respective one of the end faces to the first surface and connects to a respective one of end portions of the coil. The method of making the passive chip device is also disclosed.

10 Claims, 33 Drawing Sheets

(56) References Cited

U.S. PATENT DOCUMENTS

2016/0379749 A1* 12/2016 Hsiao .................... H01F 41/042
336/200
2016/0380041 A1* 12/2016 Hsiao ...................... H01L 28/10
257/531

FOREIGN PATENT DOCUMENTS

| TW | 200846508 | 12/2008 |
| TW | M511121 | 10/2015 |

* cited by examiner

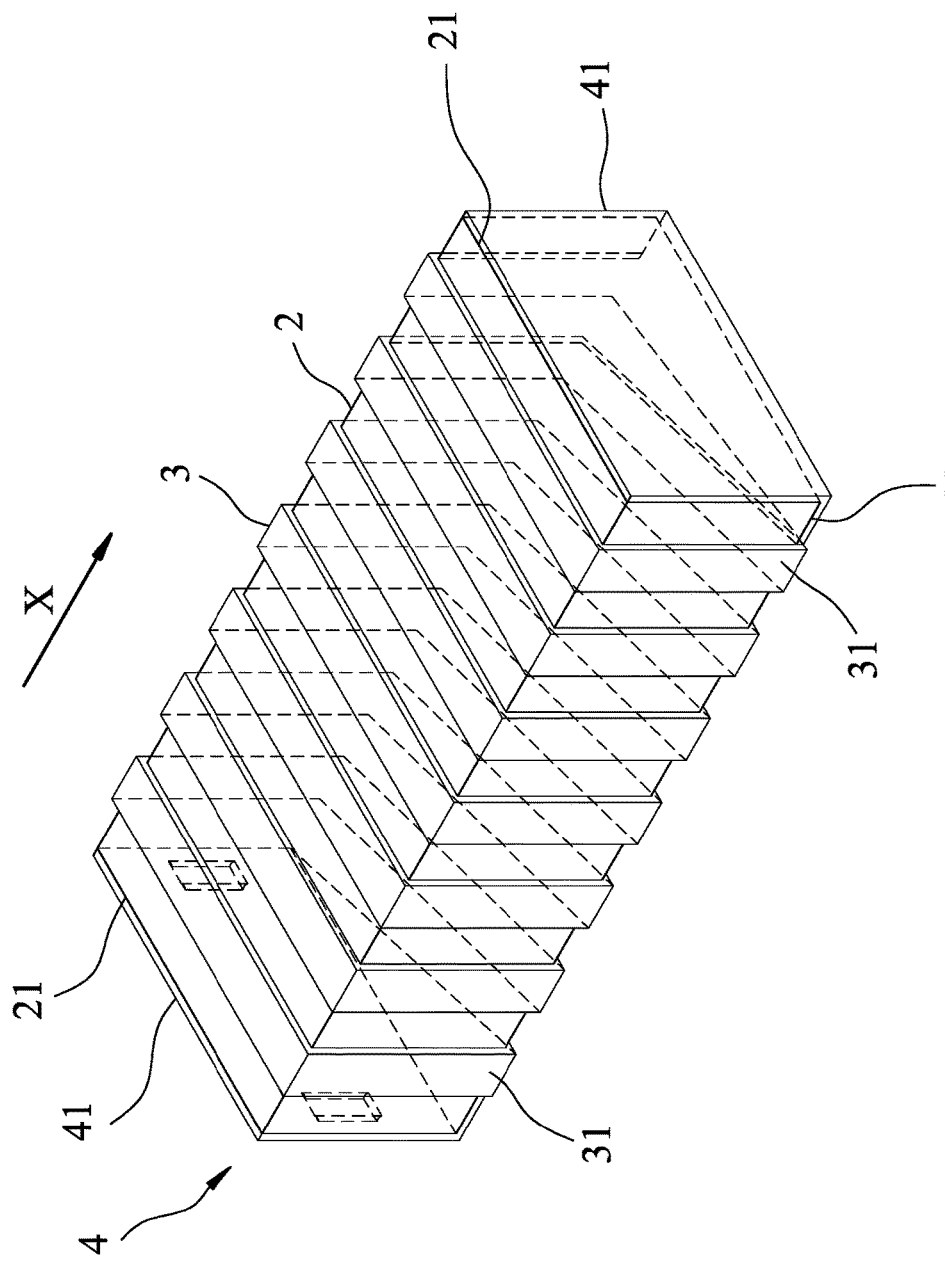

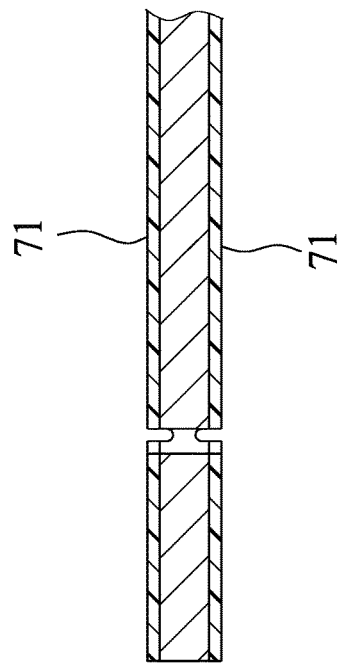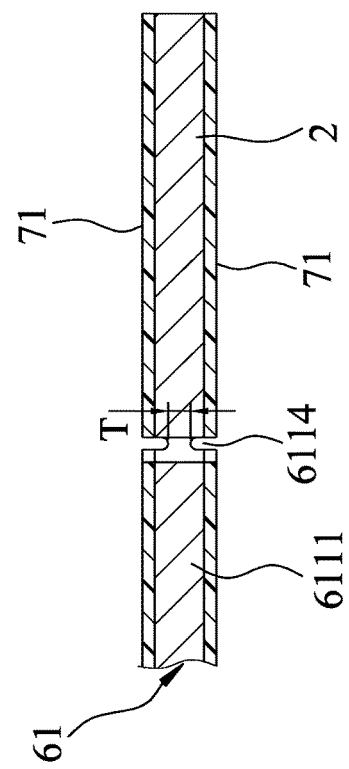
FIG.12

PASSIVE CHIP DEVICE AND METHOD OF MAKING THE SAME

CROSS-REFERENCE TO RELATED APPLICATION

This application claims priority of Taiwanese Application No. 104120533, filed on Jun. 25, 2015.

FIELD

The disclosure relates to a passive chip device and a method of making the same, more particularly to a passive chip device with terminal contacts.

BACKGROUND

A passive device is referred to as a circuit device that is not capable of providing power gain. A capacitor, an inductor, and a resistor are all considered as passive devices. There are three types of commercially available inductors namely thin film type inductors, multilayered type inductors, and wire wound type inductors.

TW patent application publication No. 201440090 A discloses a multilayered type inductor (see FIG. 1) and a method of making the same.

The method of making the multilayered type inductor includes the steps of: laminating a first circuit plate 110, a second circuit plate 120, a third circuit plate 130 and a fourth circuit plate 140 (see FIG. 2A); attaching an assembly of a supporting film 150 and a bonding pad circuit 160 to the first circuit plate 110 (see FIG. 2B); transferring the bonding pad circuit 160 from the supporting film 150 to the first circuit plate 110 (see FIG. 2C); removing the supporting film 150 from the bonding pad circuit 160 (see FIG. 2D); sintering the first, second, third and fourth circuit plates 110, 120, 130, 140 and the bonding pad circuit 160 so as to form a multilayered substrate 100 (see FIG. 2E); and scribing the multilayered substrate 100 using a scriber 170 (see FIG. 2F), so that the multilayered substrate 100 can be broken into a plurality of multilayered type inductors 10 (see FIG. 1).

Referring to FIG. 1, each of the first, second, third and fourth circuit plates 110, 120, 130, 140 includes a respective one of non-magnetic bodies 111, 121, 131, 141 and a respective one of first, second, third and fourth circuit patterns 112, 122, 132, 142. Formation of the first, second, third and fourth circuit plates 110, 120, 130, 140 requires numerous steps (a total of at least 13 steps), including punching each non-magnetic body 111, 121, 131, 141 to form holes therein, filling conductive paste in the holes, forming the first, second, third and fourth circuit patterns 112, 122, 132, 142 and sintering before laminating the first, second, third and fourth circuit plates 110, 120, 130, 140.

The multilayered type inductor 10 thus formed has drawbacks, such as undesired non-ohmic contact and Joule-heating which may be induced at the interfaces between every two adjacent ones of the first, second, third and fourth circuit patterns 112, 122, 132, 142.

A conventional method of making a thin film type inductor includes steps of: forming a coil layer (a total of 10 steps); forming an intermediate layer on the coil layer; forming a top electrode on the intermediate layer (a total of 6 steps); forming a bottom electrode (a total of 6 steps); forming a protecting layer so as to form a layered structure with an array of thin film inductors; forming a plurality of stick-breaking lines and chip-breaking lines in the layered structure; breaking the layered structure along the stick-breaking lines so as to form inductor sticks; forming side face contacts on each of the inductor sticks; breaking each inductor stick along the chip-breaking lines so as to form the semi-formed inductor chips; and forming end face contacts on each of the semi-formed inductor chips. The end face contacts cooperate with the side face contacts to define terminal contacts of each thin film type inductor.

The aforesaid method of making the thin film type inductor is relatively complicated, such as requiring numerous steps to form the terminal contacts of each inductor chip.

SUMMARY

Therefore, an object of the disclosure is to provide a passive chip device that can alleviate at least one of the drawbacks of the prior arts.

According to one aspect of the disclosure, there is provided a passive chip device that includes a chip body, a conductive coil and a surface-mount contact unit.

The chip body is in the form of a single piece, which extends in an axial direction, and which has two opposite end faces and a first surface. The end faces are opposite to each other in the axial direction. The first surface extends along the axial direction between the end faces.

The conductive coil is deposited on and surrounds the chip body for generating inductance. The conductive coil has two opposite end portions.

The surface-mount contact unit includes two spaced apart conductive terminal contacts. Each of the terminal contacts extends from a respective one of the end faces to the first surface, and contacts a respective one of the end portions of the coil.

According to another aspect of the disclosure, there is provided a passive chip device that includes a chip body, a capacitor and a surface-mount contact unit.

The chip body is in the form of a single piece, extends in an axial direction, and has two opposite end faces and first and second surfaces. The end faces are opposite to each other in the axial direction. The first and second surfaces are opposite to each other and extend along the axial direction between the end faces.

The capacitor is formed on the chip body, and has first and second conductive layers and a dielectric layer that is sandwiched between the first and second conductive layers and that is disposed adjacent to the second surface and distal from the first surface.

The surface-mount contact unit is formed on the chip body and includes two spaced apart conductive terminal contacts. Each of the terminal contacts has a first segment overlapping a respective one of the end faces along the axial direction and contacting a respective one of the first and second conductive layers, and a second segment extending from the first segment and formed on the first surface.

According to yet another aspect of the disclosure, there is provided a method of making a surface-mountable passive chip device.

The method includes: forming a patterned wafer which has a peripheral end portion and at least one passive-component unit that includes a connecting portion, a breaking line, and a plurality of spaced apart chip bodies, the connecting portion being connected to the peripheral end portion, the breaking line having a plurality of connecting tabs that are spaced apart from one another, each of the connecting tabs being disposed between and interconnecting the connecting portion and a respective one of the chip bodies, each of the chip bodies extending in an axial direction and having two opposite end faces and a first surface, the end faces being opposite to each other in the axial direction, the first surface extending along the axial direction between the end faces; forming a functional layered structure on each of the chip bodies; forming a conductive seed layer on the functional layered structure on each of the chip bodies; forming a contact-defining patterned photoresist layer on the conductive seed layer on each of the chip bodies, such that two opposite end portions of the conductive seed layer, which are respectively disposed adjacent to the end faces of each of the chip bodies, are exposed from the contact-defining patterned photoresist layer; forming a surface-mount contact unit having two spaced apart conductive terminal contacts that are respectively formed on the end portions of the conductive seed layer on each of the chip bodies, each of the conductive terminal contacts being electro-connected to the functional layered structure and extending from a respective one of the end faces to the first surface; removing the contact-defining patterned photoresist layer and the remaining portion of the conductive seed layer that is covered by the contact-defining patterned photoresist layer; and breaking the patterned wafer along the breaking line by applying an external force thereto so as to form a plurality of passive chip devices.

BRIEF DESCRIPTION OF THE DRAWINGS

Other features and advantages of the disclosure will become apparent in the following detailed description of the embodiments with reference to the accompanying drawings, of which:

FIG. 3 is a perspective view illustrating the first embodiment of a passive chip device according to the disclosure;

FIG. 12 is a sectional view taken along line XII-XII of FIG. 12;

DETAILED DESCRIPTION

Figure 1:
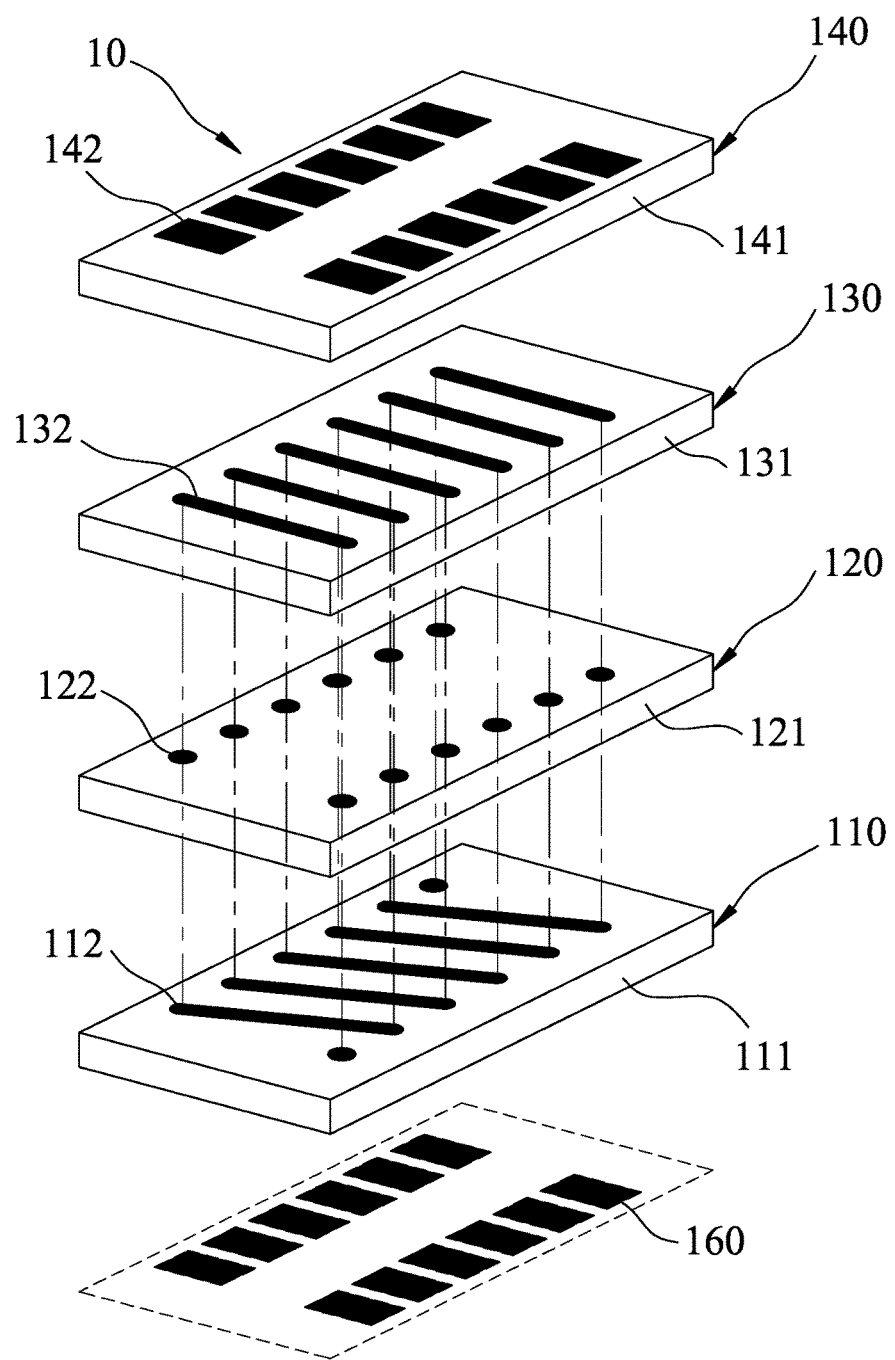
FIG. 1 is an exploded perspective view of a multilayered type inductor disclosed in TW patent application publication No. 201440090 A.
Figure 2A:
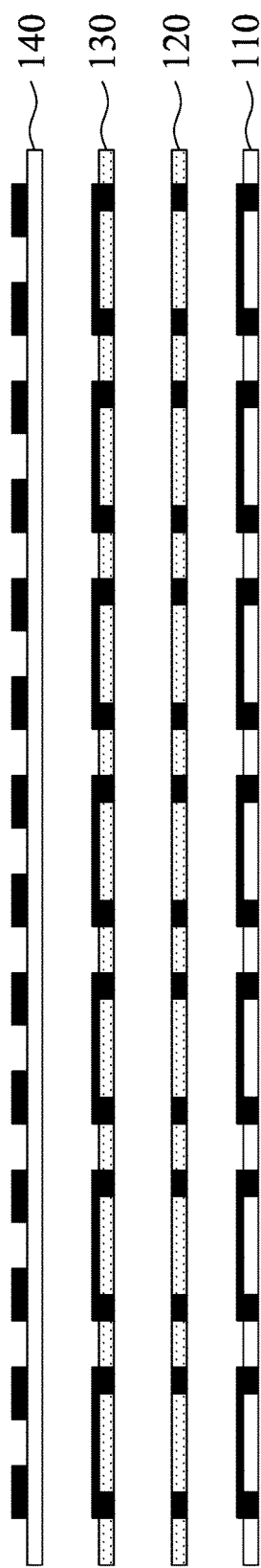
FIGS. 2A to 2F are sectional views illustrating consecutive steps of a method of making the multilayered type inductor of FIG. 1.
Figure 2B:
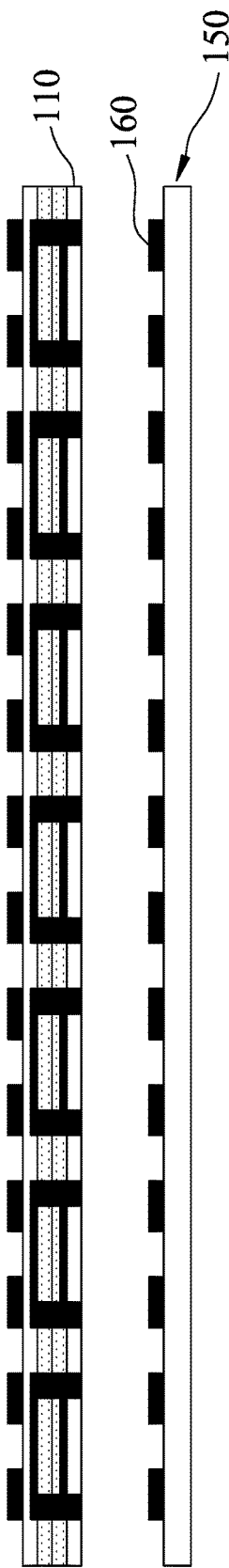
Figure 2C:
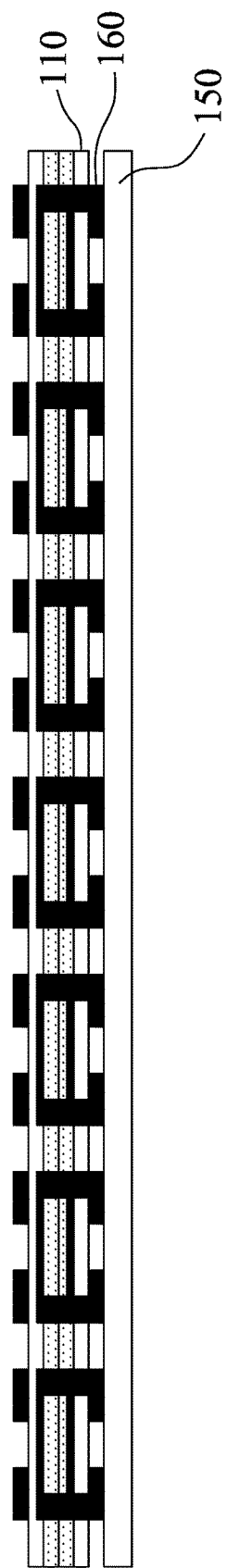
Figure 2D:
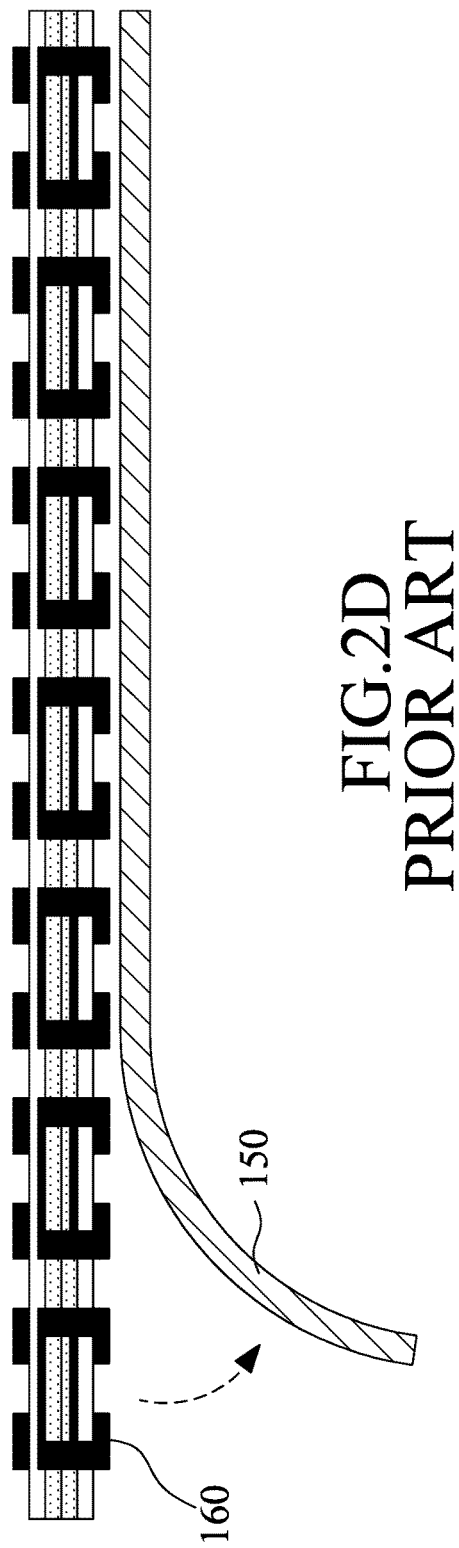
Figure 2E:
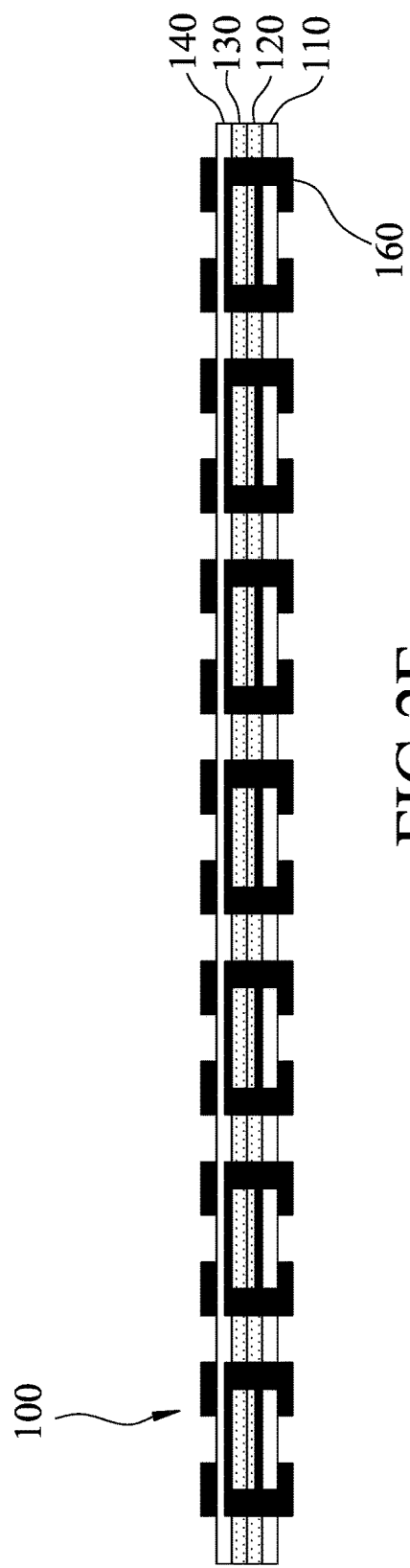
Figure 2F:
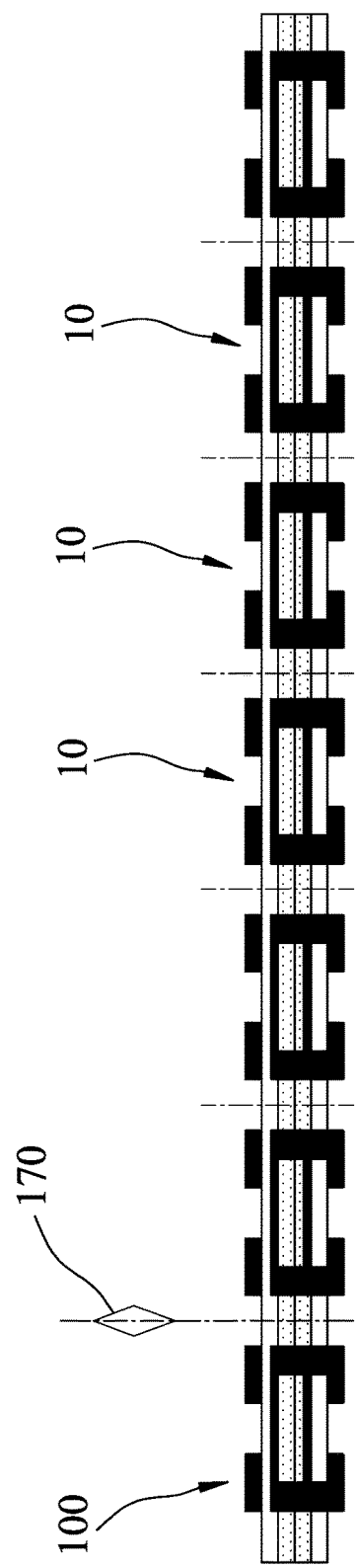

Before the disclosure is described in greater detail, it should be noted that like elements are denoted by the same reference numerals throughout the disclosure.

Referring to FIG. 3, the first embodiment of the passive chip device includes a chip body 2, a conductive coil 3, and a surface-mount contact unit 4.

The chip body 2 is in the form of a single piece, and thus has a higher mechanical strength than that of the conventional multilayered inductor. The chip body 2 extends in an axial direction (X), and has two opposite end faces 21 and a first surface 22. The end faces 21 are opposite to each other in the axial direction (X). The first surface 22 extends along the axial direction (X) between the end faces 21.

The conductive coil 3 is deposited on and surrounds the chip body 2 for generating inductance. The conductive coil 3 has two opposite end portions 31.

The surface-mount contact unit 4 includes two spaced apart conductive terminal contacts 41. Each of the terminal contacts 41 extends from a respective one of the end faces 21 to the first surface 22, and contacts a respective one of the end portions 31 of the conductive coil 3.

The conductive terminal contacts 41 of the surface-mount contact unit 4 are made from a material containing Ni and a metal selected from the group consisting of Au and Sn.

The chip body 2 may be made from a magnetic material or a non-magnetic material. The magnetic material is magnetic metal or magnetic ceramic. The non-magnetic material is a Si-based material or non-magnetic metal. The magnetic metal may be Fe, Co or Ni. The magnetic ceramic may be a ferrite ($Fe_3O_4$) with an inverse spinel structure. In certain embodiments, the chip body 2 is made from magnetic metal, so that the passive chip device is a magnetic-core inductor. The Si-based material may be quartz, a Si wafer, $Si_3N_4$, or SiC. The non-magnetic metal may be Cu. In certain embodiments, the chip body 2 is made from quartz, so that the passive chip device is an air-core inductor.

When the chip body 2 is made from the magnetic metal or the non-magnetic metal, the first embodiment of the passive chip device further includes an insulator layer (not shown) which is formed on the chip body 2. The conductive coil 3 is deposited on the insulator layer, so as to prevent the passive chip device from short circuit.

Figure 4:
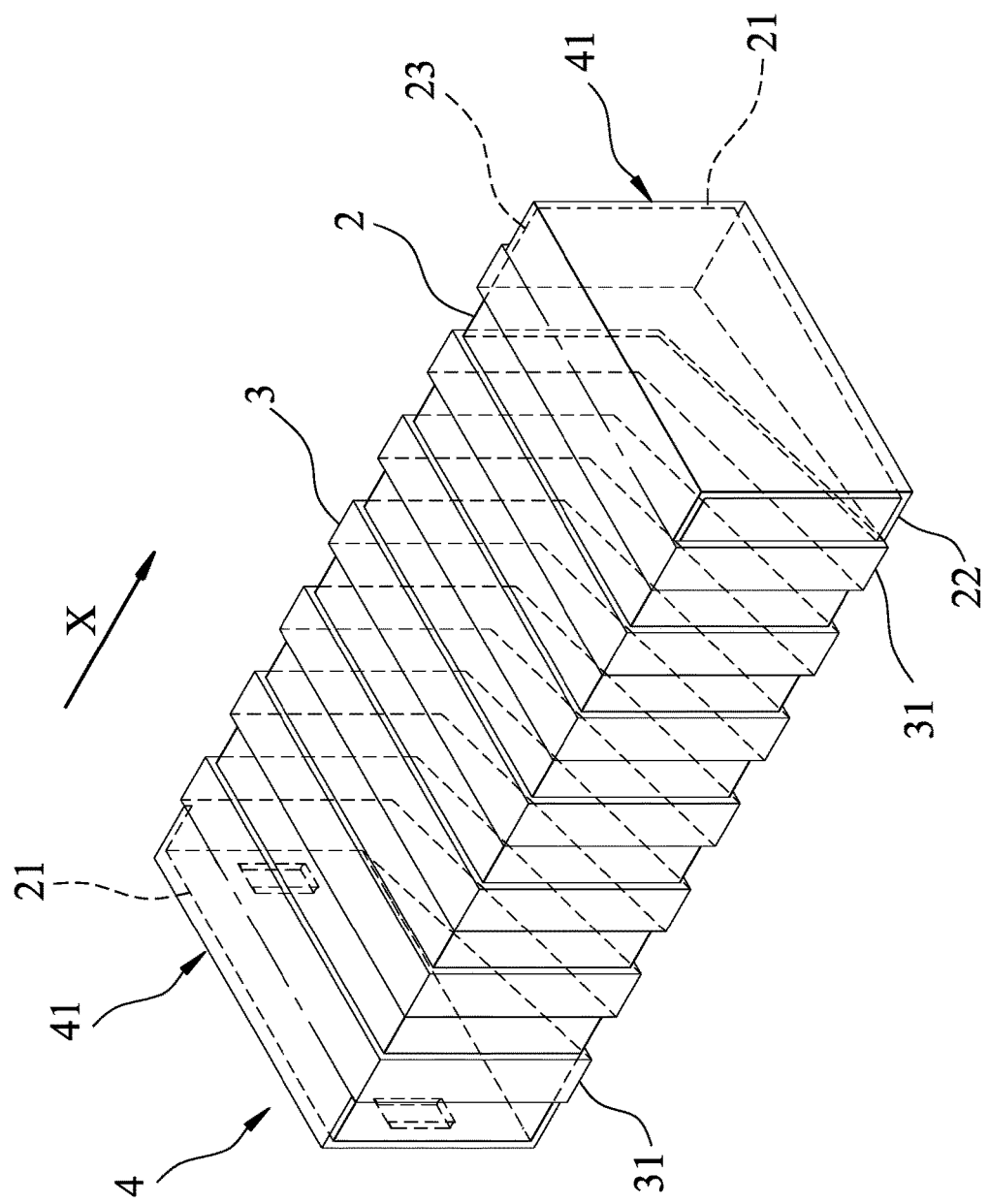
FIG. 4 is a perspective view illustrating the second embodiment of the passive chip device according to the disclosure.

Referring to FIG. 4, the second embodiment differs from the first embodiment in that the chip body 2 further has a second surface 23 which is opposite to the first surface 22 and which extends along the axial direction (X) between the end surfaces 21. Each of the terminal contacts 41 further extends from the respective one of the end faces 21 to the second surface 23.

Figure 5:
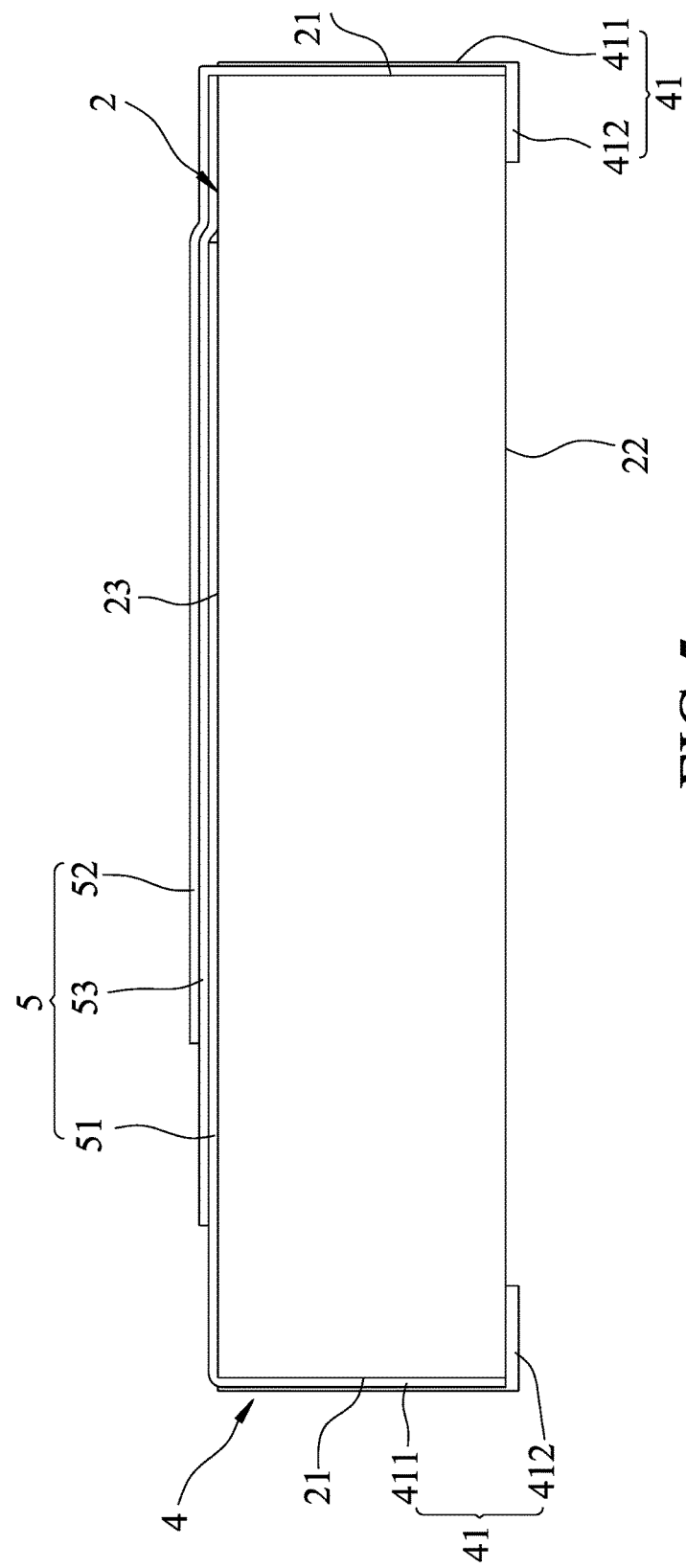
FIG. 5 is a side view illustrating the third embodiment of a passive chip device according to the disclosure.

Referring to FIG. 5, the third embodiment differs from the first embodiment in that the third embodiment includes a capacitor 5 instead of the conductive coil 3.

The capacitor 5 is formed on the chip body 2 and has first and second conductive layers 51, 52 and a dielectric layer 53 that is sandwiched between the first and second conductive layers 51, 52 and that is disposed adjacent to the second surface 23 and distal from the first surface 22.

Each of the terminal contacts 41 has a first segment 411 overlapping a respective one of the end faces 21 and contacting a respective one of the first and second conductive layers 51, 52, and a second segment 412 extending from the first segment 411 and formed on the first surface 22.

In this embodiment, the first conductive layer 51 is formed on the second surface 23 and a respective one of the end faces 21. The second conductive layer 52 is formed on the first conductive layer 51 and the other respective one of the end faces 21. The first segment 411 is formed on and electrically connected to the respective one of the first and second conductive layers 51, 52.

The following description illustrates a method of making the passive chip device of the first embodiment of the disclosure, and should not be construed as limiting the scope of the disclosure. The method includes the steps of S1 to S7.

Figure 6:
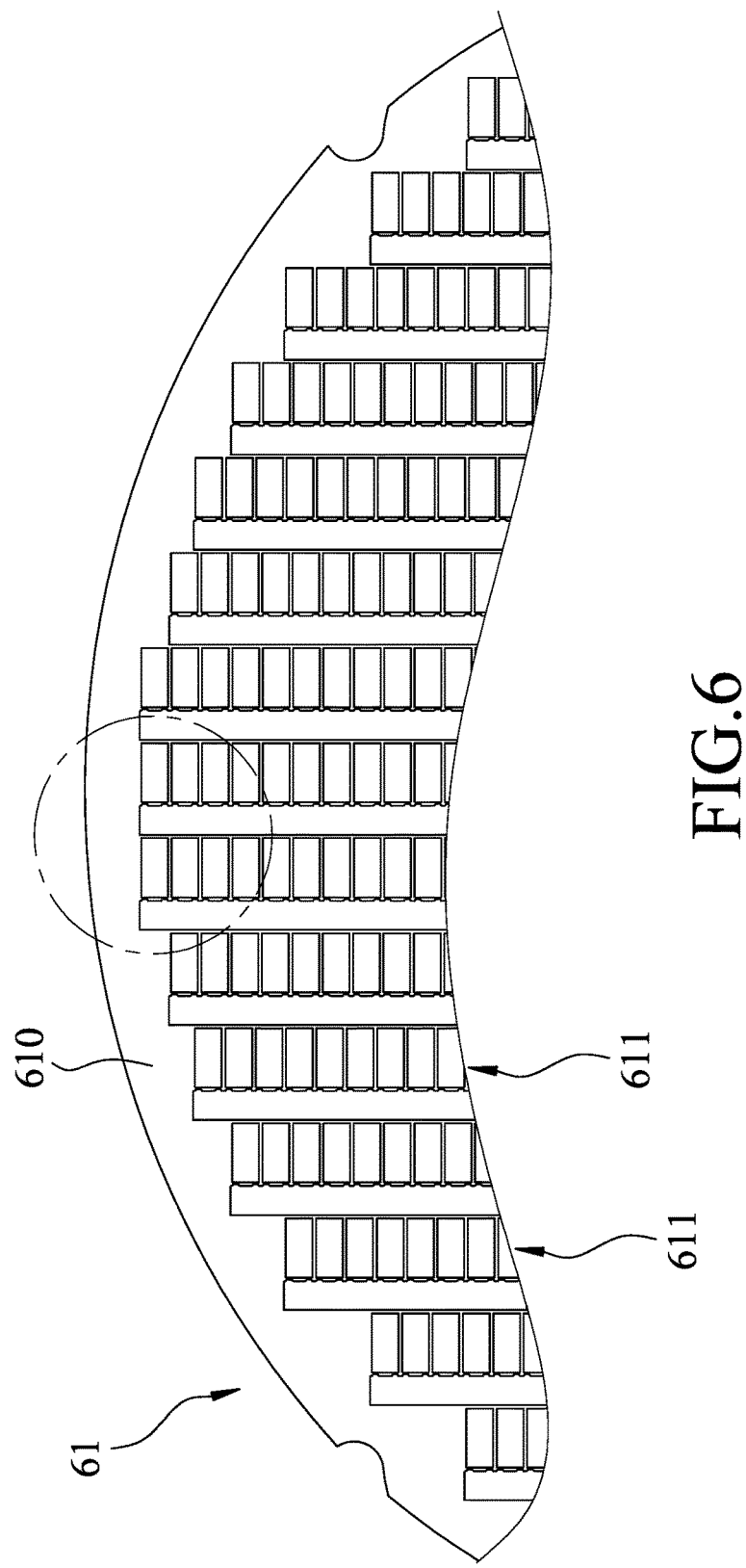
FIG. 6 is a top view illustrating a patterned wafer formed in step S1 of a method of making the first embodiment of the passive chip device according to the disclosure.
Figure 7:
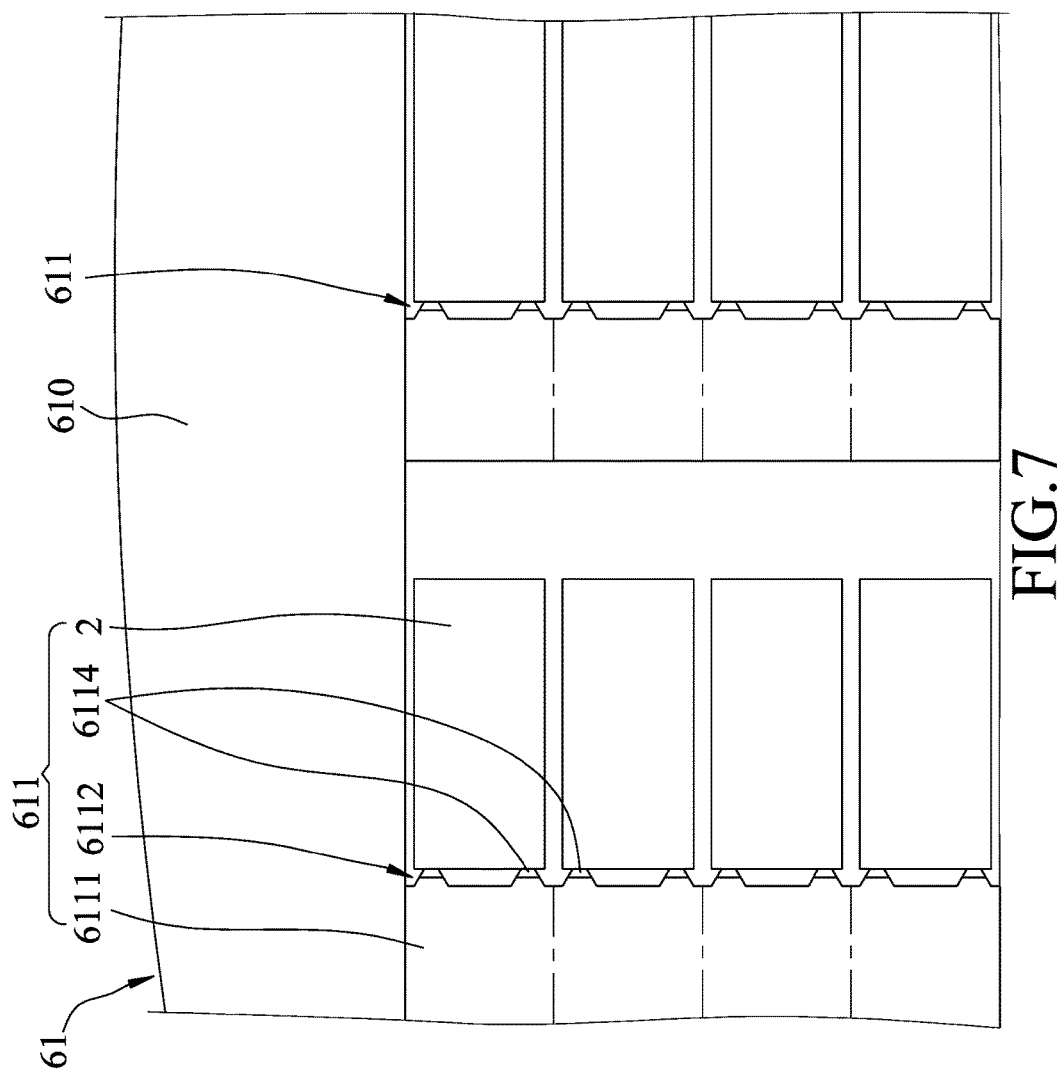
FIG. 7 is an enlarge view of an encircled portion of FIG. 6.
Figure 8:
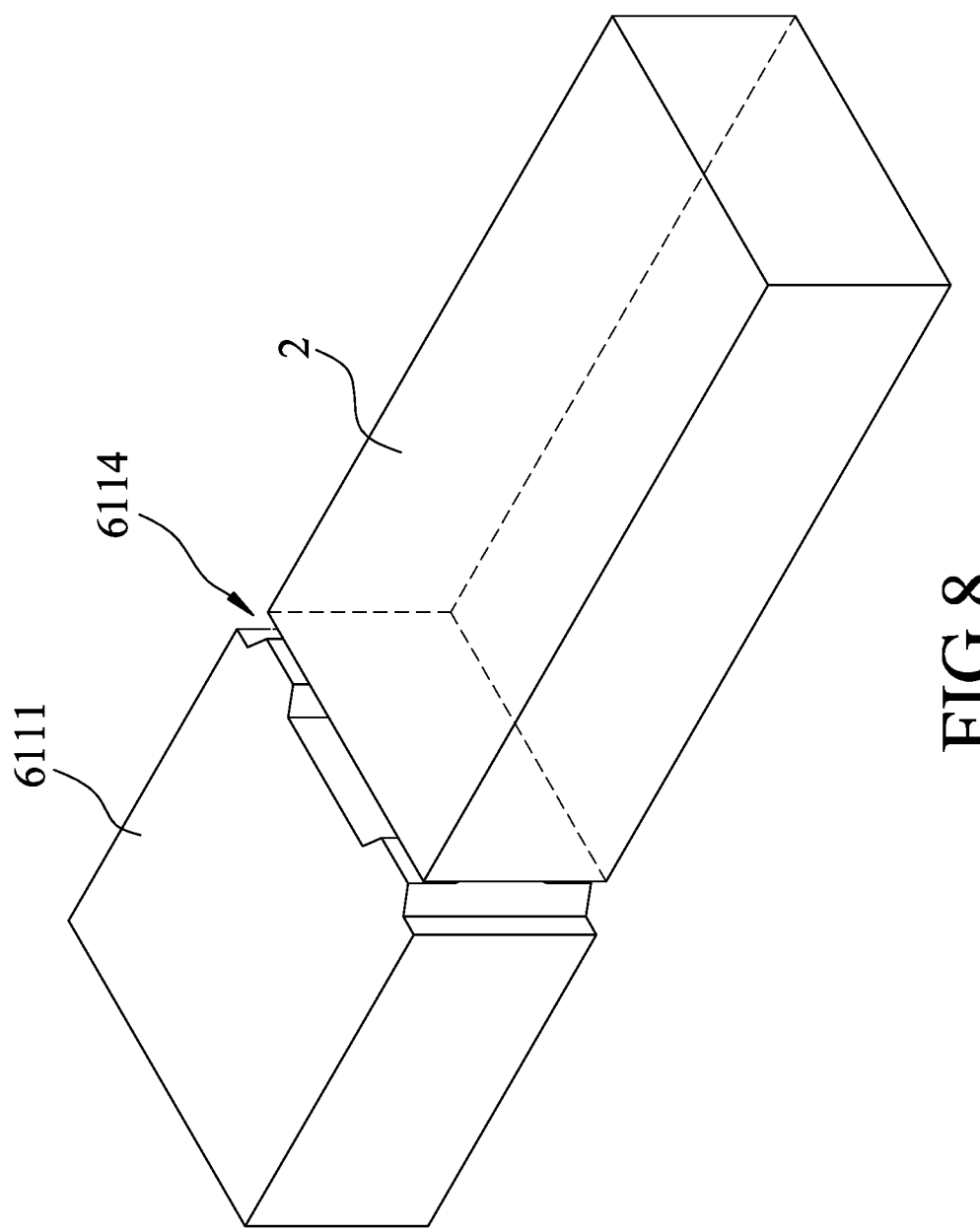
FIG. 8 is a perspective view illustrating a passive-component unit of the patterned wafer shown in FIG. 6
Figure 9:
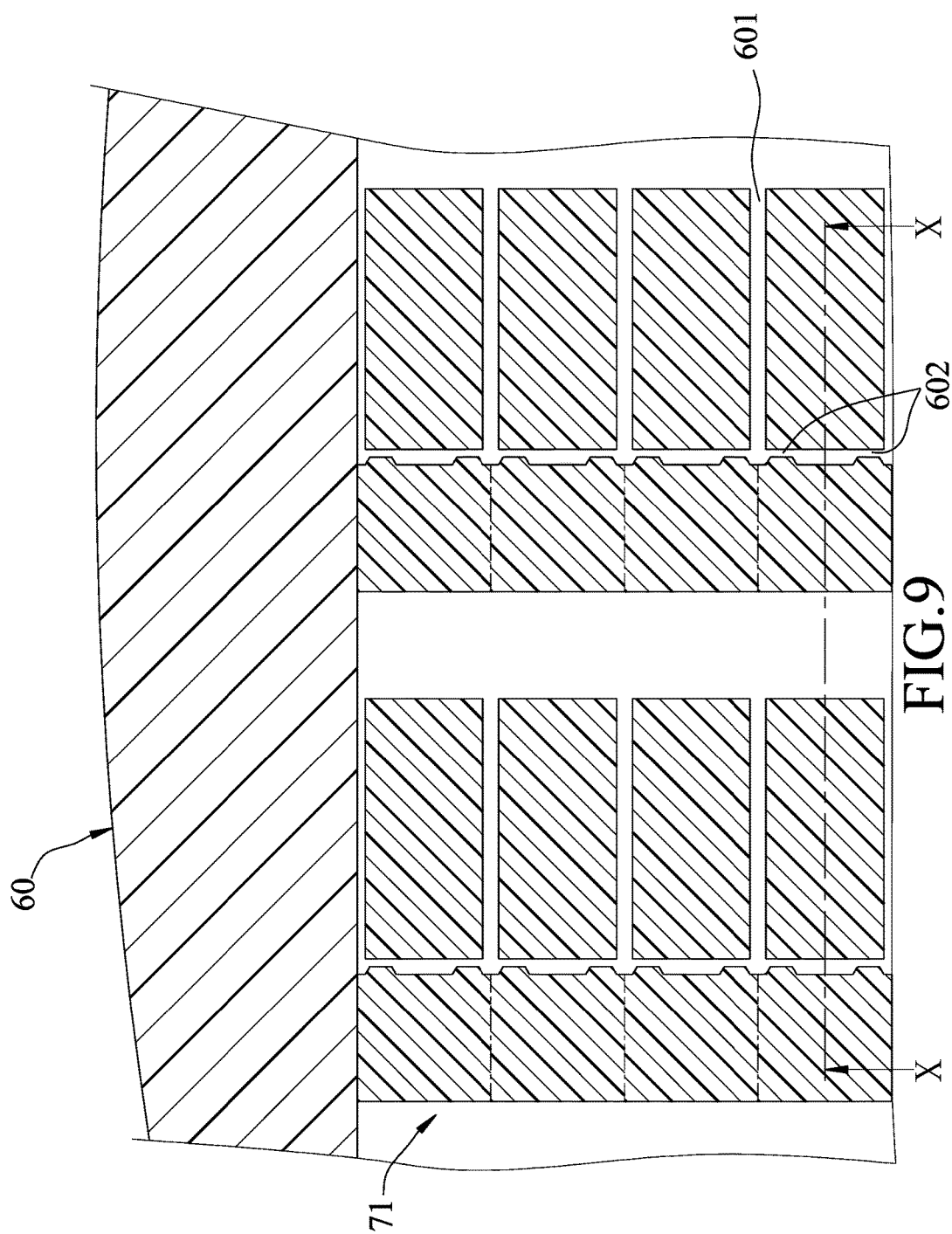
FIG. 9 is a fragmentary top view illustrating a patterned photoresist layer used in step S1 of the method of making the first embodiment of the passive chip device according to the disclosure.
Figure 10:
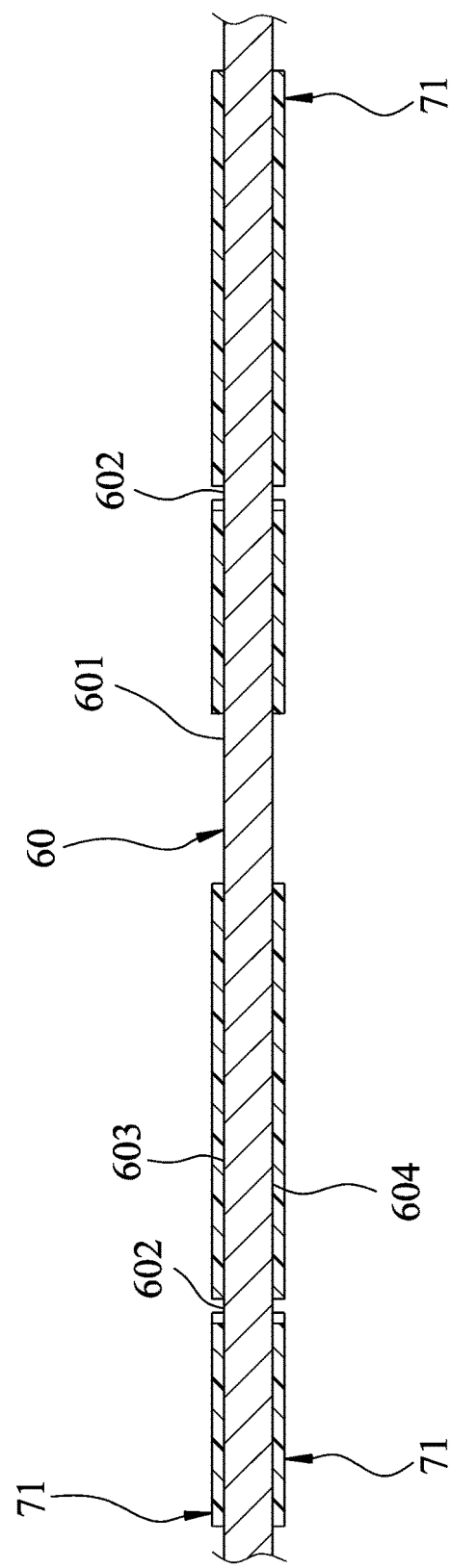
FIG. 10 is a sectional view taken along line X-X of FIG. 10.
Figure 11:
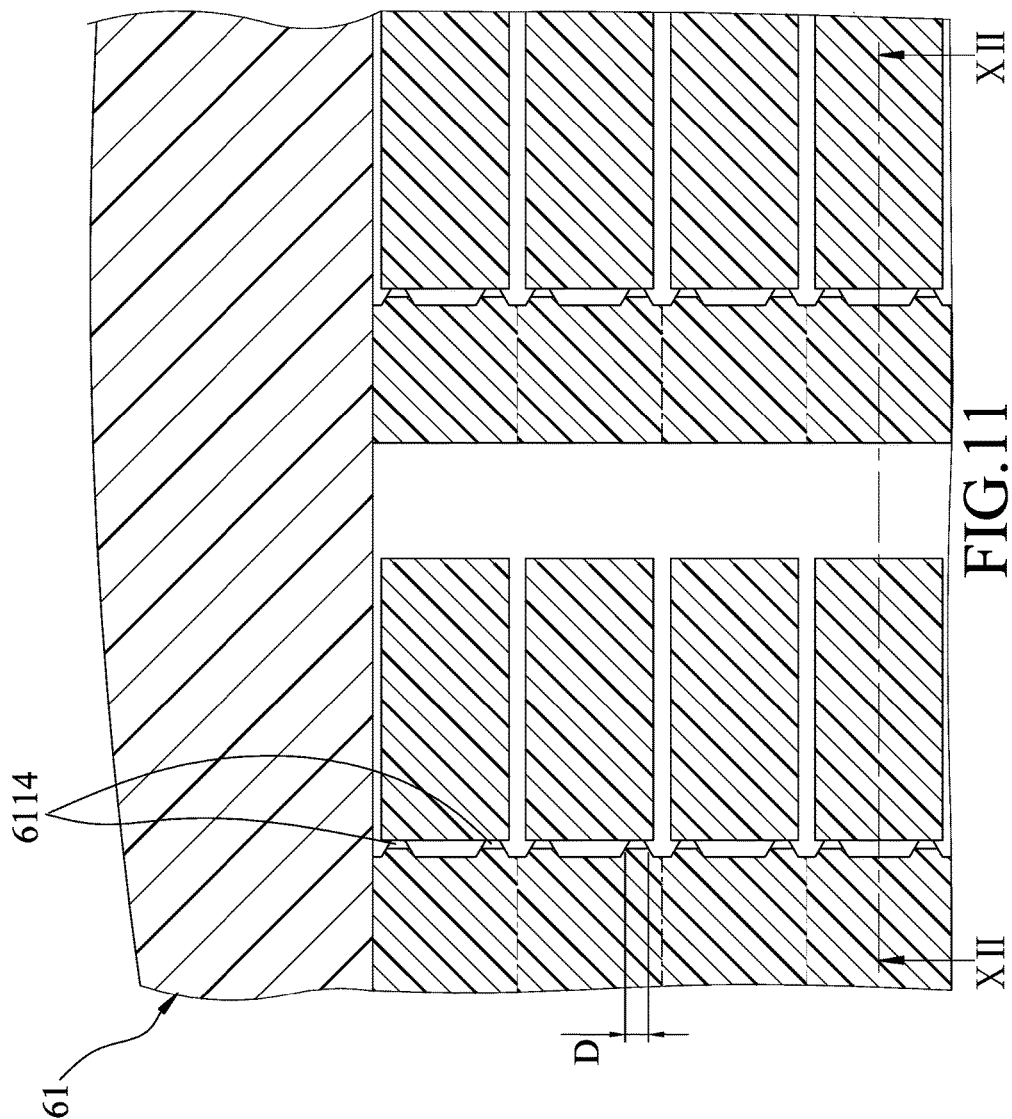
FIG. 11 is a fragmentary top view illustrating an etching procedure used in step S1 of the method of making the first embodiment of the passive chip device according to the disclosure.

In step S1 (see FIGS. 6 to 8), a patterned wafer 61 which has a peripheral end portion 610 and at least one passive-component unit 611 that includes a connecting portion 6111, a breaking line 6112, and a plurality of spaces apart chip bodies 2, is formed. The connecting portion 6111 is connected to the peripheral end portion 610. The breaking line 6112 has a plurality of connecting tabs 6114 that are spaced apart from one another. Each of the connecting tabs 6114 is disposed between and interconnecting the connecting portion 6111 and a respective one of the chip bodies 2. Each of the chip bodies 2 has a structure as mentioned above.

The patterned wafer 61 is formed from a wafer 60 using etching techniques or punching techniques.

In certain embodiments (see FIGS. 9 to 12), the wafer 60 may be made from quartz, and two first patterned photoresist layers 71 are respectively formed on top and bottom surfaces 603, 604 of the wafer 60, such that each of the top and bottom surfaces 603, 604 of the wafer 60 has wider exposed regions 601 and narrow exposed regions 602 which are exposed from the respective one of the first patterned photoresist layers 71. The narrow exposed regions 602 have an etching rate less than those of the wider exposed regions 601. The wafer 60 is subsequently patterned using etching techniques so as to form the patterned wafer 61.

Each of the connecting tabs 6114 is reduced in width (D) from the connecting portion 6111 toward the respective one of the chip bodies 2. Each of the connecting tabs 6114 has a thickness (T) less than that of the connecting portions 6111 and that of the chip bodies 2.

In certain embodiments, the wafer 60 may be made from the non-magnetic metal or the magnetic metal, and the patterned wafer 61 is formed by punching techniques using a punching mold (not shown) with an array of holes. Each of the connecting tabs 6114 is etched or scribed (or cut using laser cutting techniques) so as to have the thickness (T) less than that of the connecting portions 6111 and that of the chip bodies 2.

In certain embodiments, the wafer may be made from ceramic green. The ceramic green is patterned using punching techniques, followed by sintering so as to form the patterned wafer 61 with an improved mechanism strength.

In step S2 (see FIGS. 13A to 13D), a functional layered structure 9 is formed on each of the chip bodies 2.

In step S2, the forming of the functional layered structure 9 includes: forming a layered structure-defining seed layer 81 on each of the chip bodies 2; forming a layered structure-defining patterned photoresist layer 82 on the layered structure-defining seed layer 81, such that a region 810 of the layered structure-defining seed layer 81 is exposed from the layered structure-defining patterned photoresist layer 82; and plating a metal layer (not shown) on the exposed region 810 of the layered structure-defining seed layer 81 so as to form the functional layered structure 9. In this embodiment, the functional layered structure 9 is in the form of the coil 3 which surrounds the respective one of the chip bodies 2.

In certain embodiments, when the patterned wafer 61 is made from the magnetic metal or the non-magnetic metal, the step S2 further includes a step of: forming an insulator layer (not shown) on each of the chip bodies 2 before formation of the layered structure-defining seed layer 81.

It should be noted that the layered structure-defining seed layer 81 may be made from a catalytically active material selected from the group consisting of Pt, Pd, Au, Ag, and Cu, or a conductive material. When the layered structure-defining seed layer 81 is made from the catalytically active material, the metal layer is formed through chemical plating techniques. When the layered structure-defining seed layer 81 is made from the conductive material, the metal layer is formed through electro-plating techniques.

In this embodiment, the forming of the functional layered structure 9 further includes: removing the layered structure-defining patterned photoresist layer 82 and a portion of the layered structure-defining seed layer 81 that is covered with the layered structure-defining patterned photoresist layer 82 from each of the chip bodies 2.

Figure 13A:
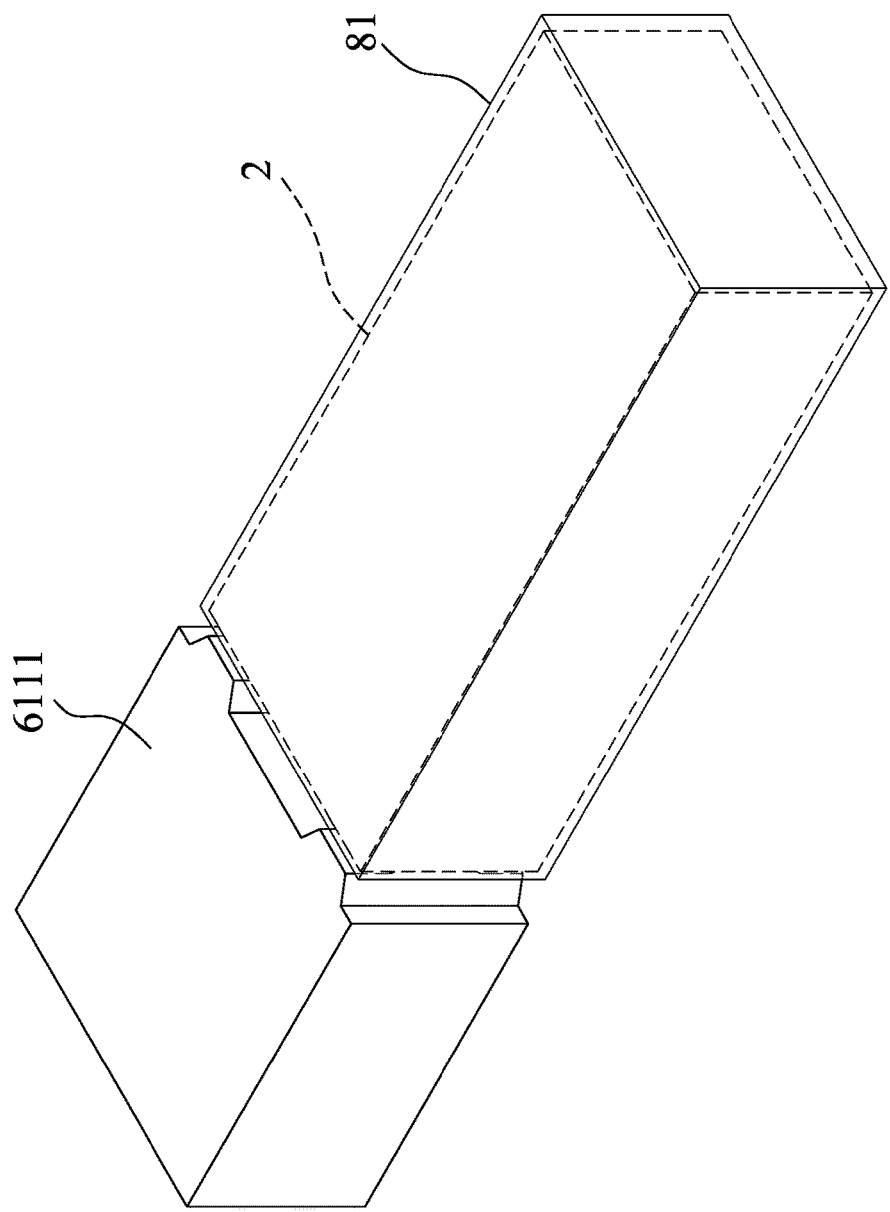
FIGS. 13A to 13H are perspective views illustrating steps S2 to S6 of the method of making the first embodiment of the passive chip device according to the disclosure.
Figure 13B:
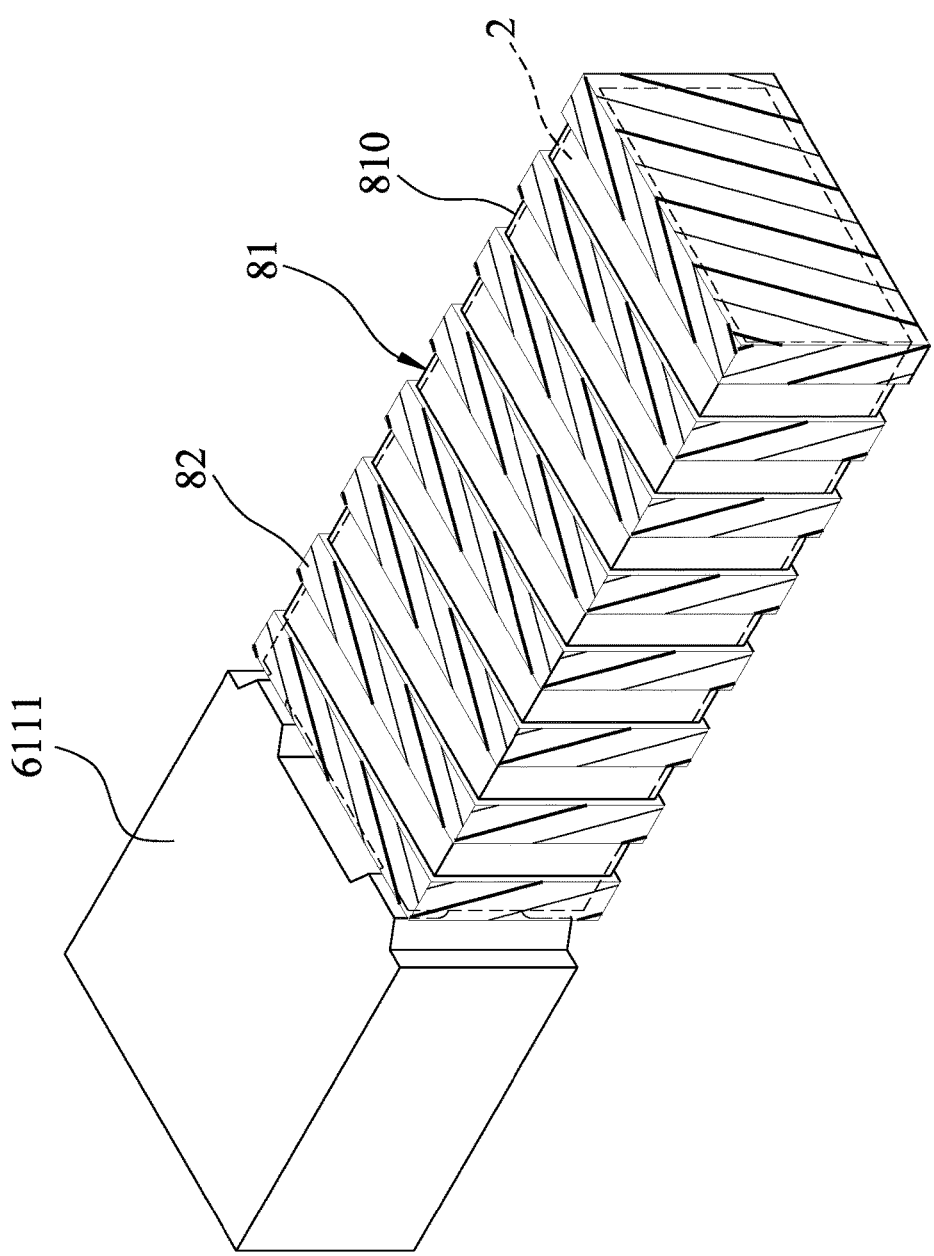
Figure 13C:
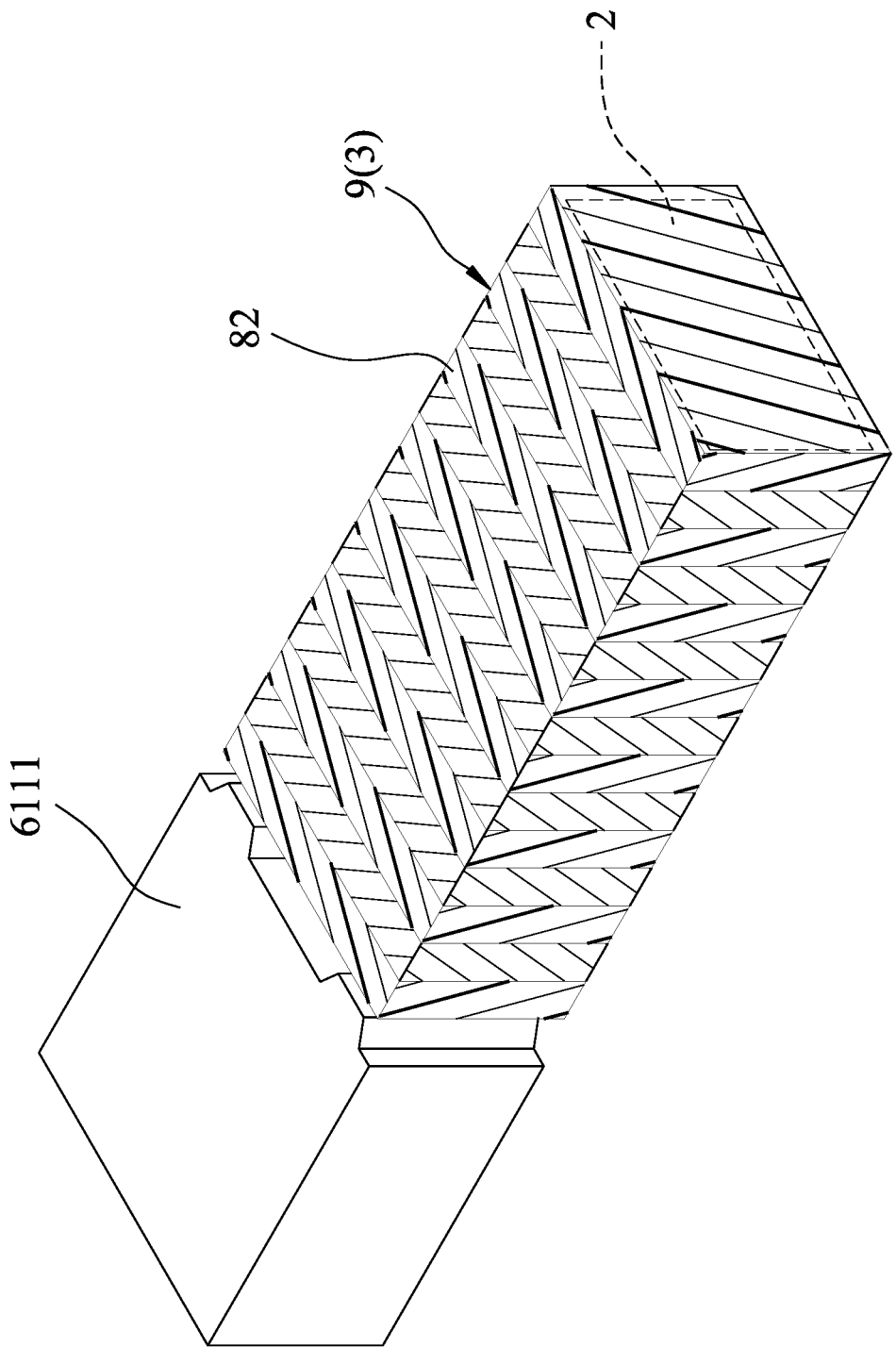
Figure 13D:
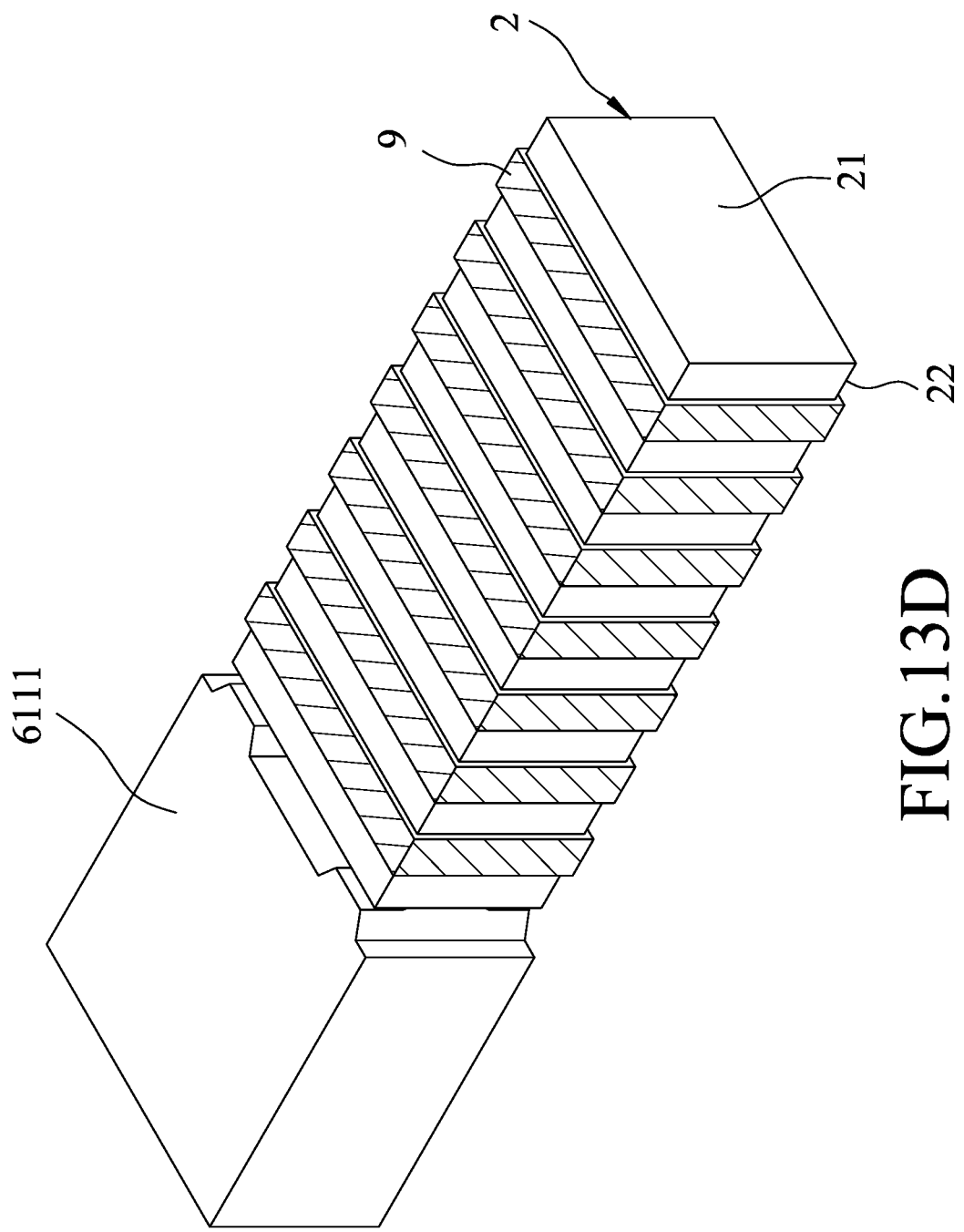
Figure 13E:
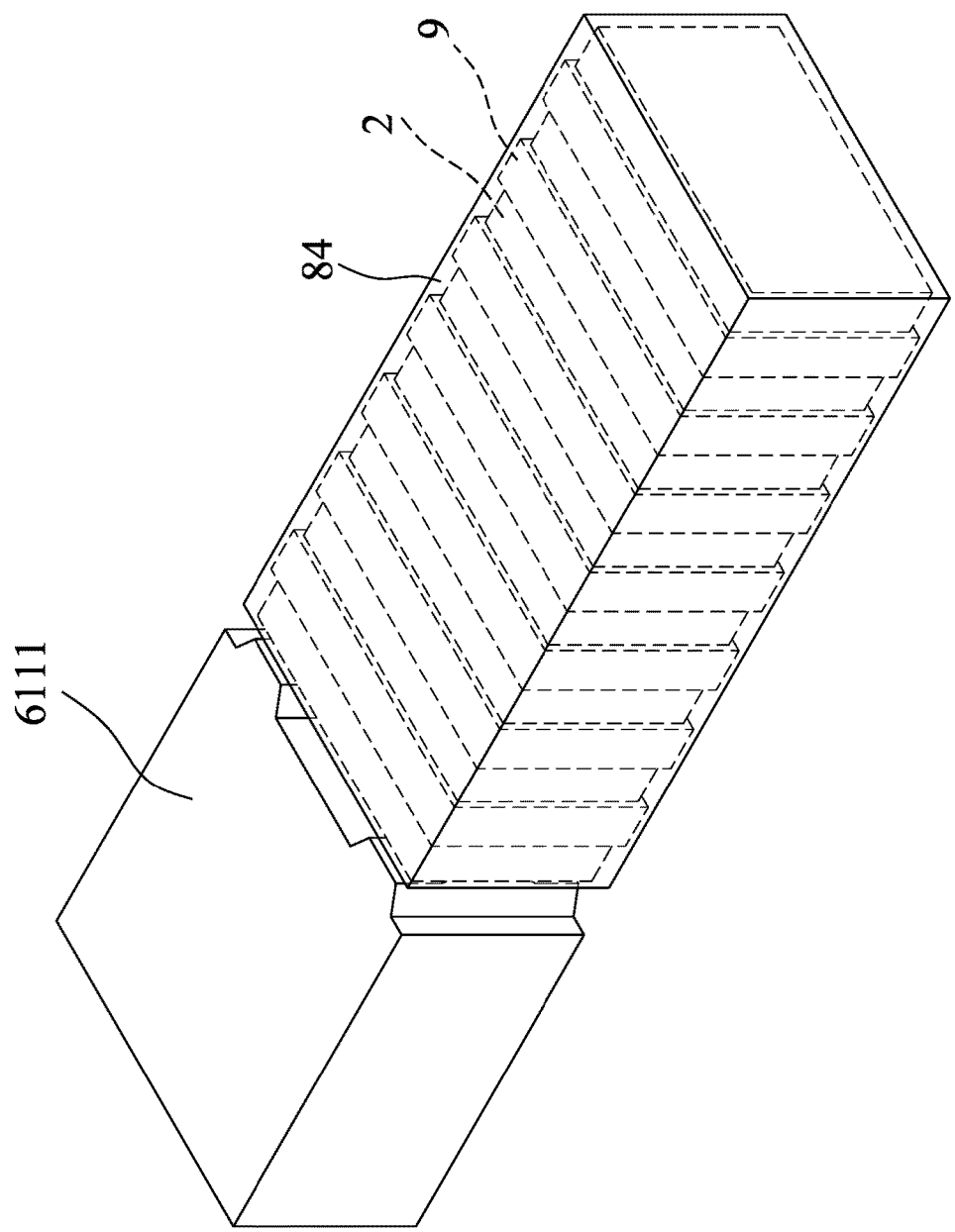

In step S3 (see FIG. 13E), a conductive seed layer 84 is formed on the functional layered structure 9 on each of the chip bodies 2.

Figure 13F:
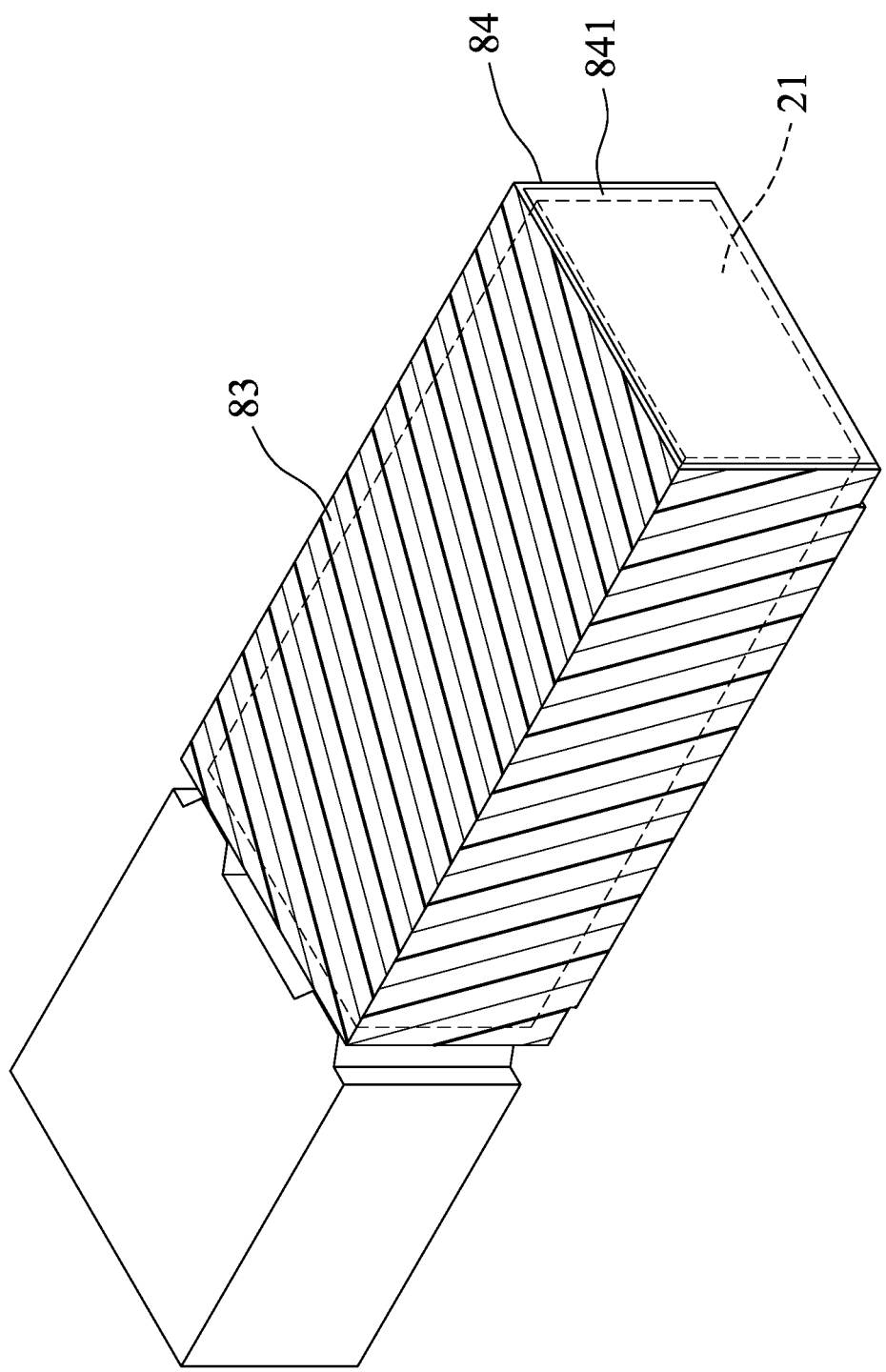
Figure 13G:
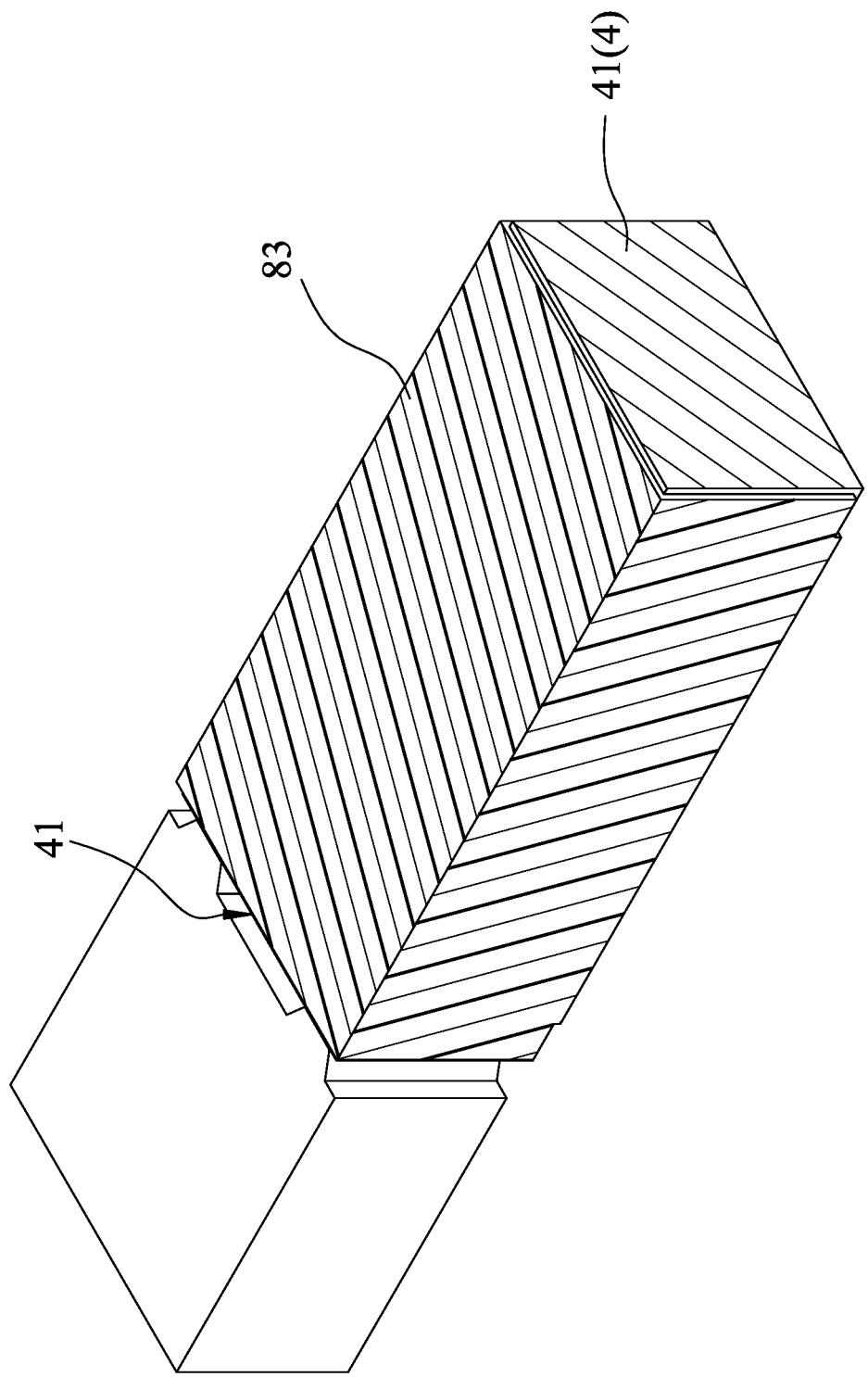

In step S4 (see FIG. 13F), a contact-defining patterned photoresist layer 83 is formed on the conductive seed layer 84, such that two opposite end portions 841 of the conductive seed layer 84, which are respectively disposed adjacent to the end faces 21 of each of the chip bodies 2, are exposed from the contact-defining patterned photoresist layer 83.

In step S5 (see FIG. 13D to 13G), the surface-mount contact unit 4 of a metal is formed on each of the chip bodies 2. The surface-mount contact unit 4 has two spaces apart conductive terminal contacts 41 that are respectively formed on the end portions 841 of the conductive seed layer 84. Each of the conductive terminal contacts 41 is electro-connected to the functional layered structure 9 and extends from a respective one of the end faces 21 to the first surface 22 of the chip body 2.

In this embodiment, the first surface 22 defines a bottom side of the chip body 2.

It should be noted that the conductive seed layer is made from a catalytically active material selected from the group consisting of Pt, Pd, Au, Ag, and Cu, or a conductive material. When the conductive seed layer 84 is made from the catalytically active material, the surface-mount contact unit 4 is formed through chemical plating techniques. When the conductive seed layer 84 is made from the conductive material, the surface-mount contact unit 4 is formed through electro-plating techniques.

In this embodiment, the conductive seed layer 84 is made from the catalytically active material, and the surface-mount contact unit 4 is formed through chemical plating techniques.

Figure 13H:
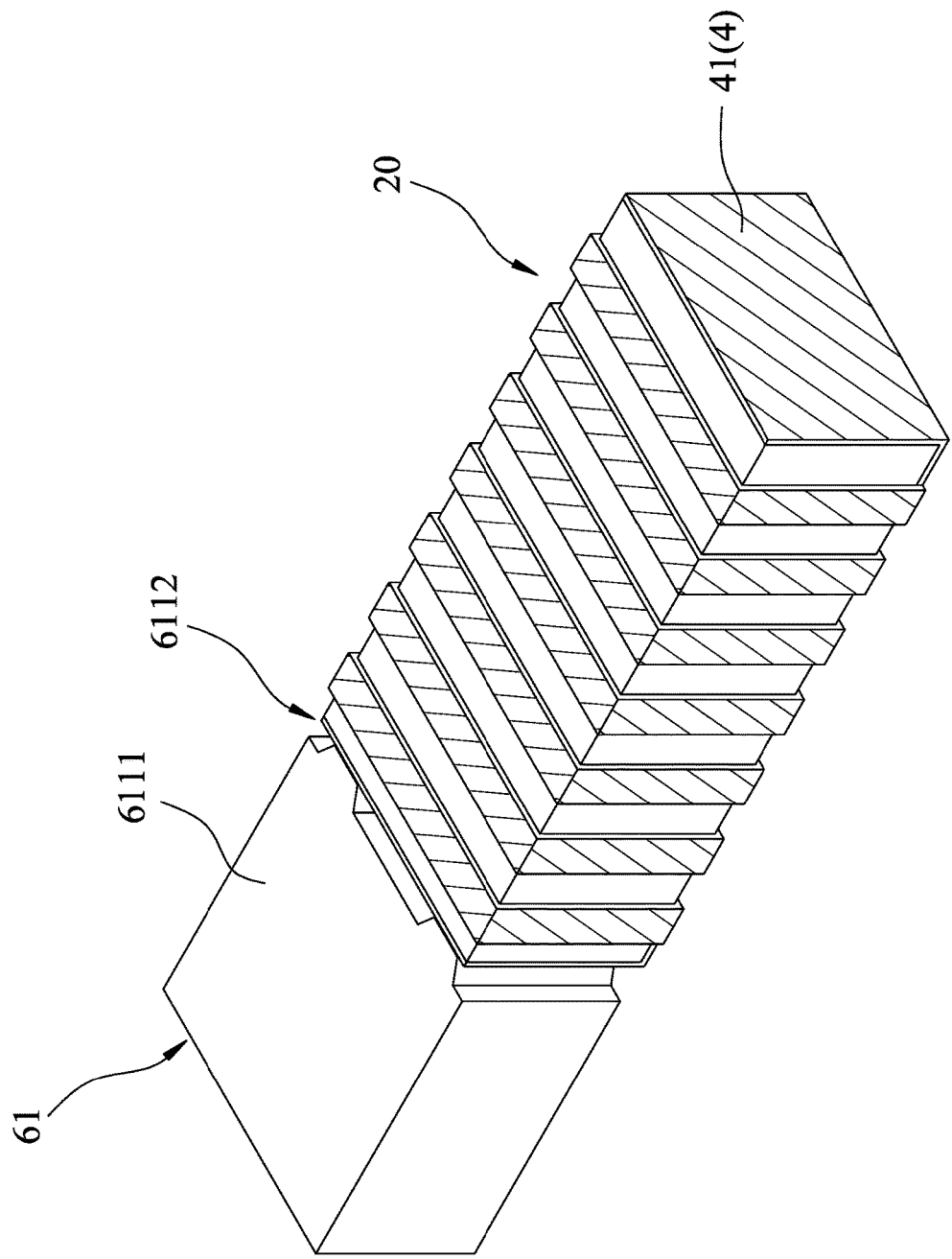

In step S6 (see FIGS. 13F to 13H), the contact-defining patterned photoresist layer 83 and a remaining portion of the conductive seed layer 84 that is covered by the contact-defining patterned photoresist layer 83 are removed.

Figure 14:
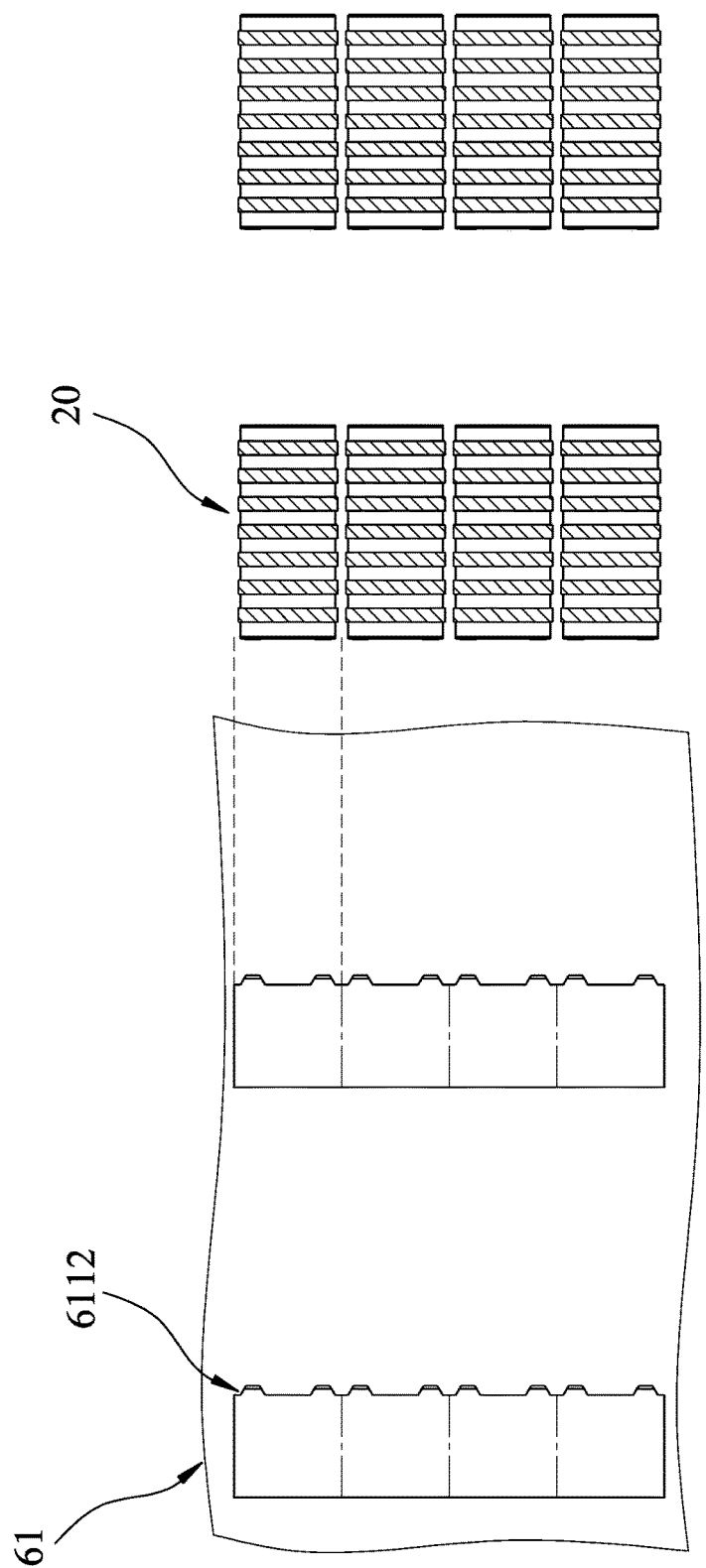
FIG. 14 is a fragmentary top view illustrating step S7 of the method of making the first embodiment of the passive chip device according to the disclosure.

In step S7 (see FIG. 14), the patterned wafer 61 is broken along the breaking line 6112 by applying an external force thereto so as to form a plurality of passive chip devices 20.

Figure 15:
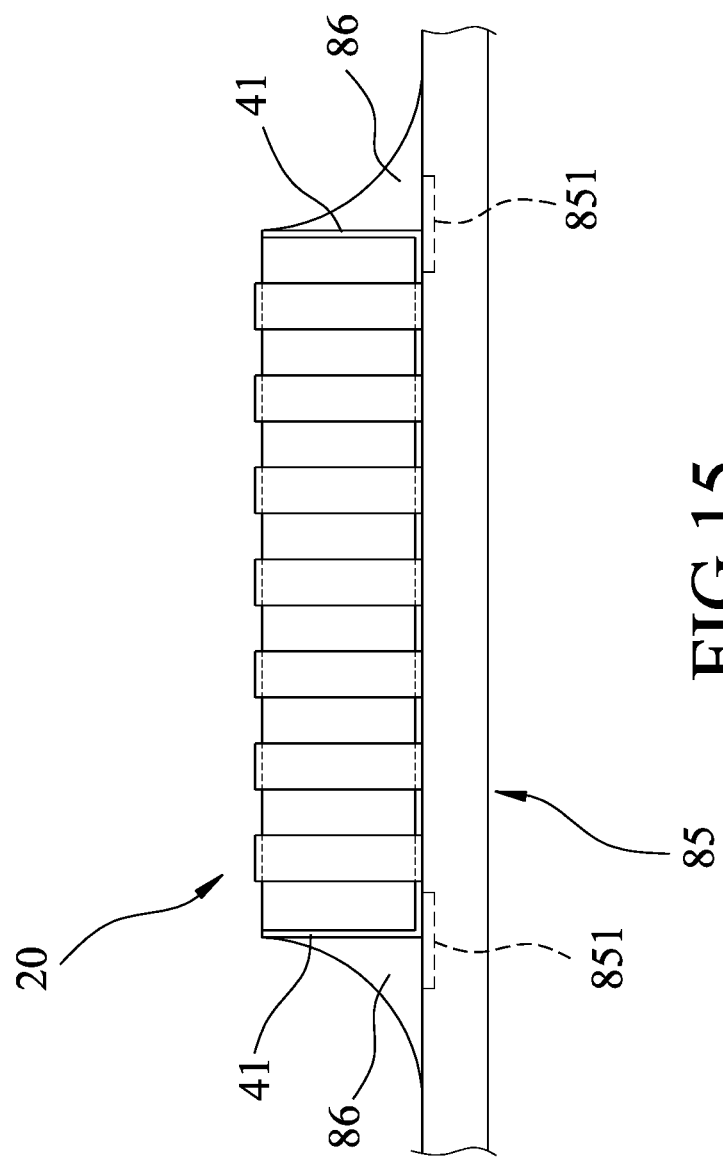
FIG. 15 is a fragmentary side view illustrating the first embodiment of a passive chip device according to the disclosure mounted to a circuit plate.
Figure 16A:
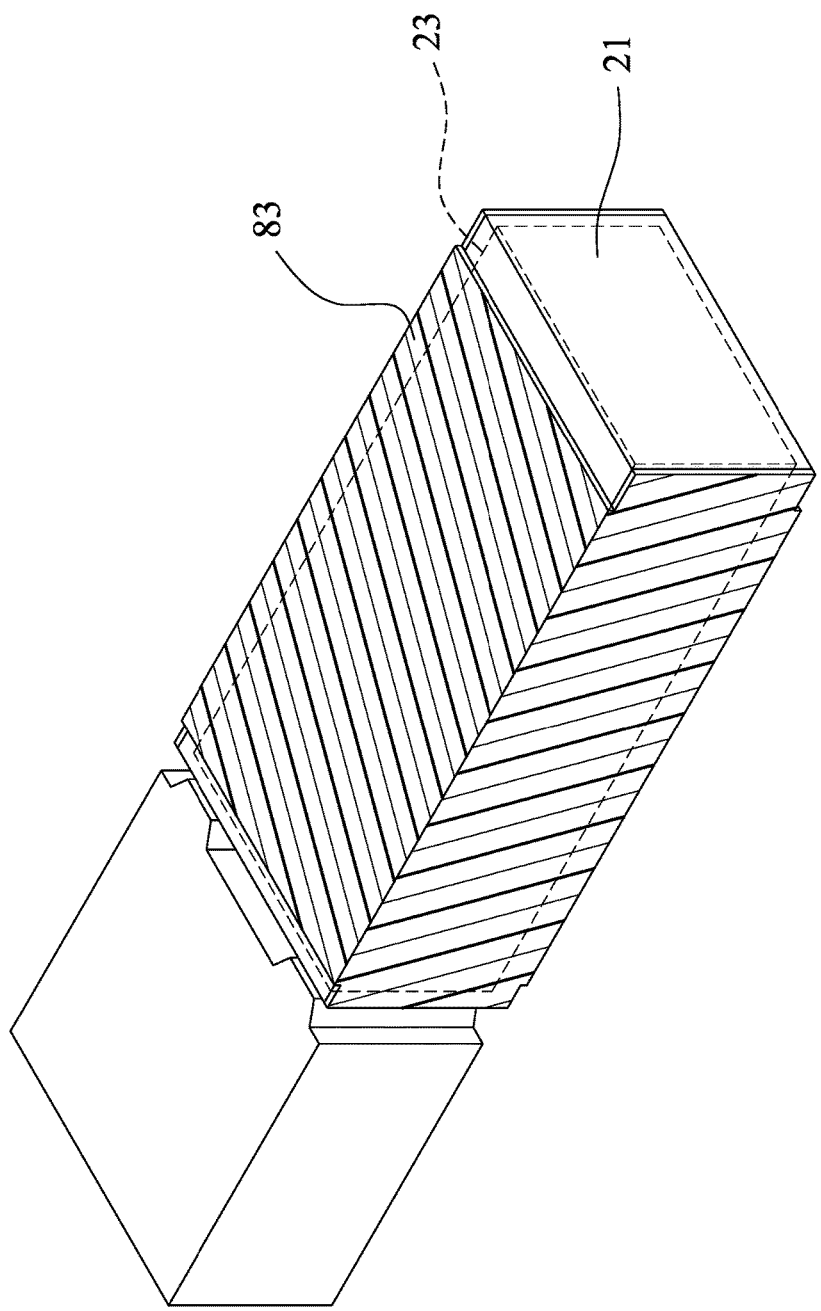
FIGS. 16A to 16C are perspective views illustrating consecutive steps of the method of making the second embodiment of the passive chip device according to the disclosure.
Figure 16B:
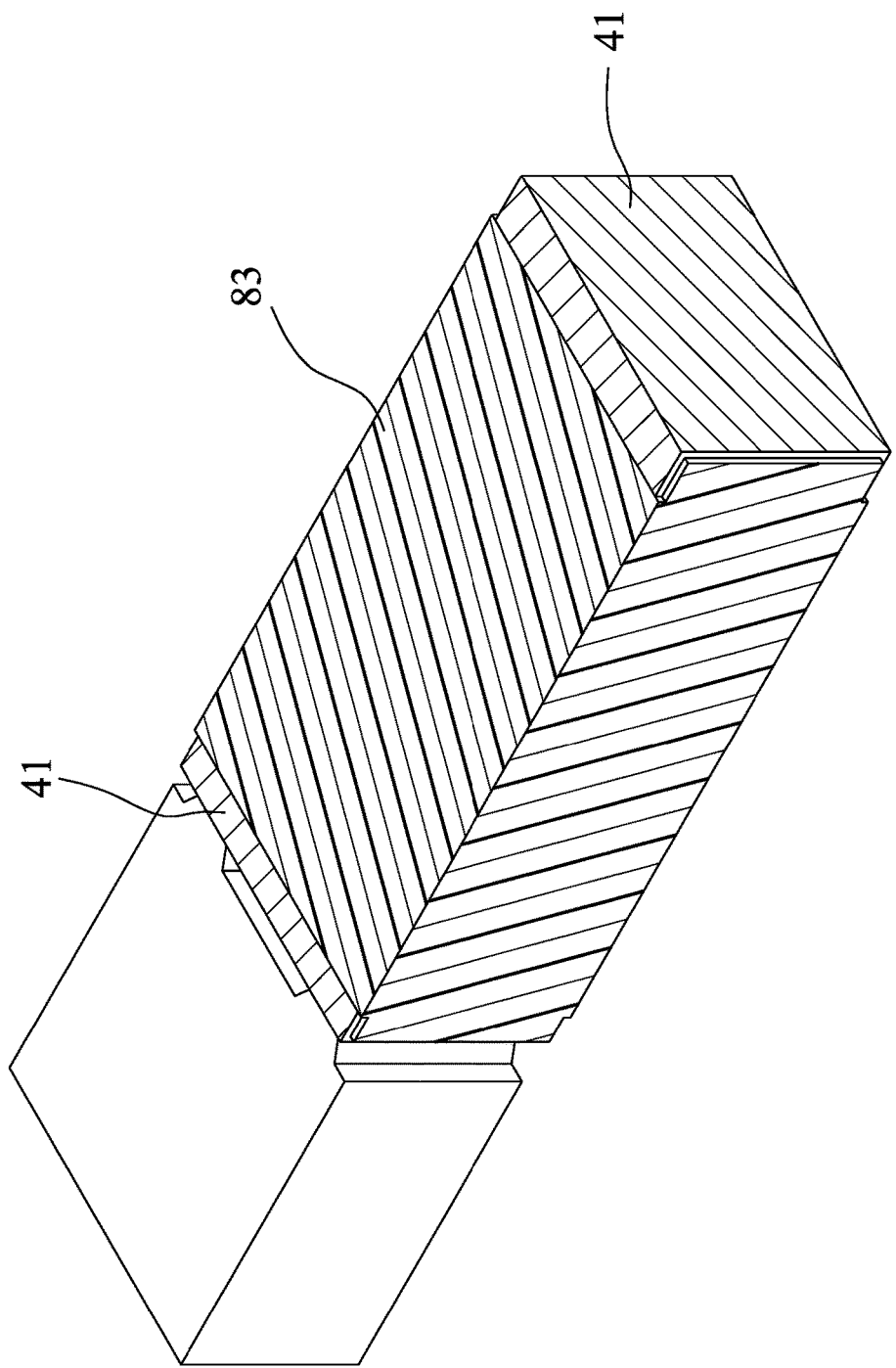
Figure 16C:
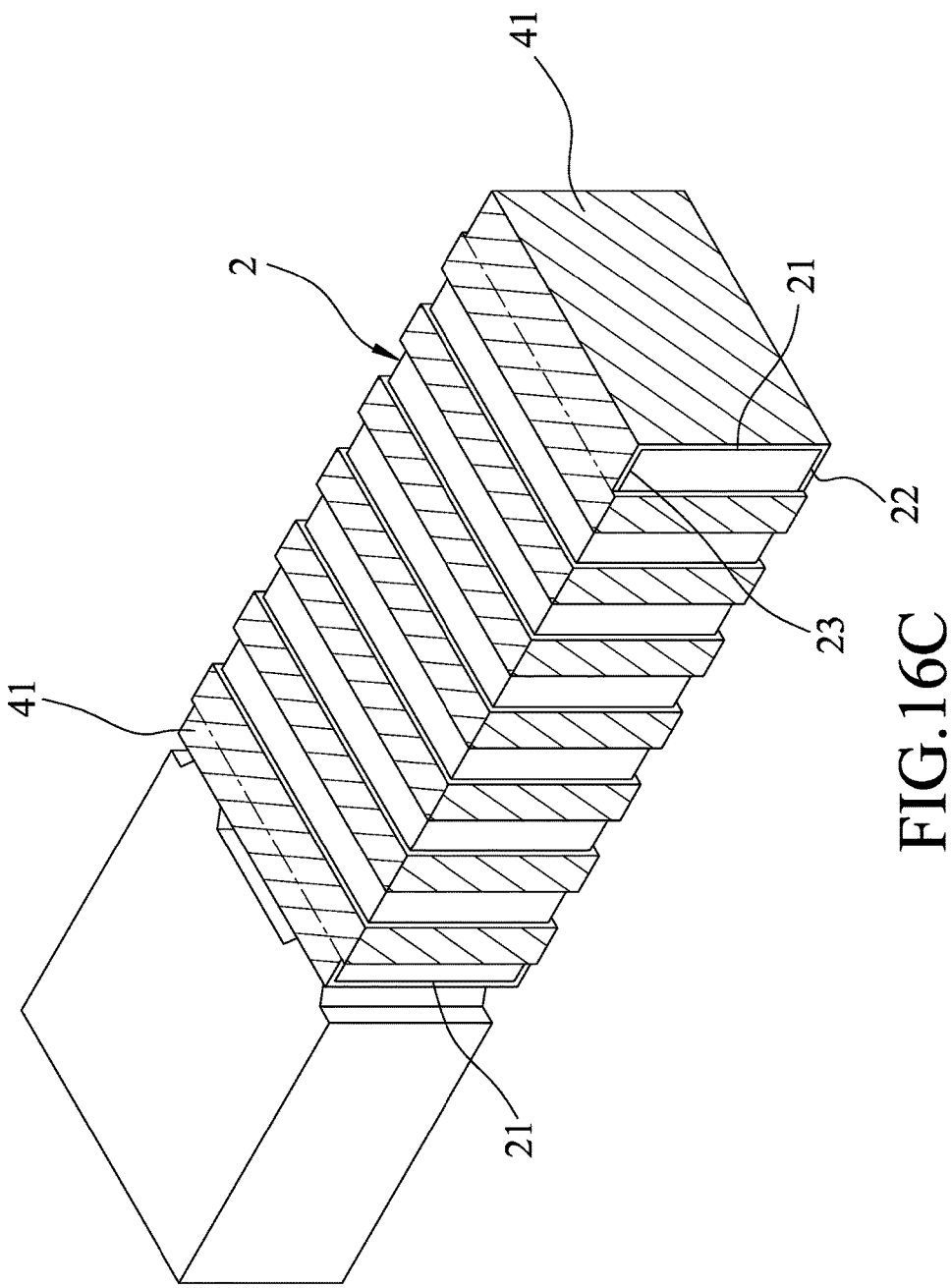
Figure 17A:
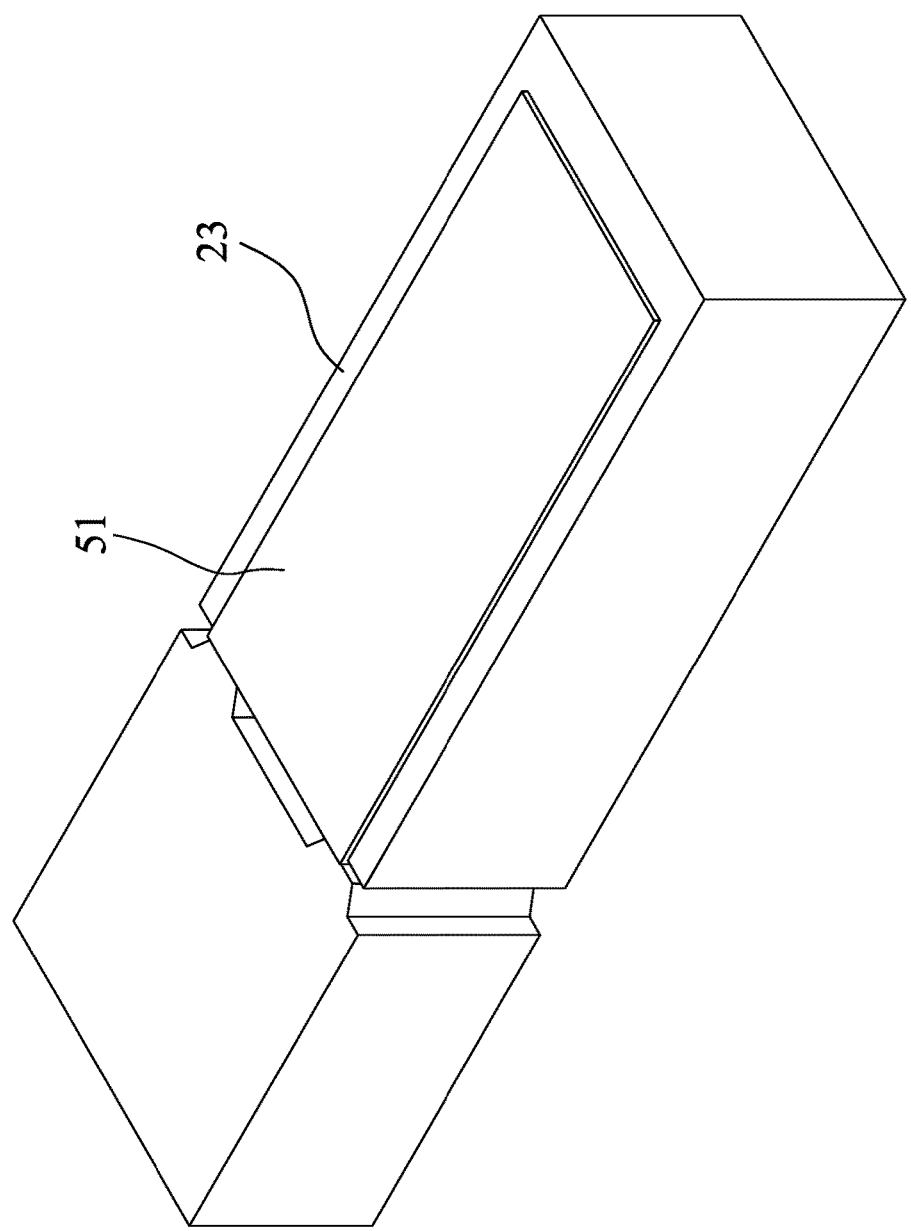
FIGS. 17A to 17C are perspective views illustrating consecutive steps of the method of making the third embodiment of the passive chip device according to the disclosure.
Figure 17B:
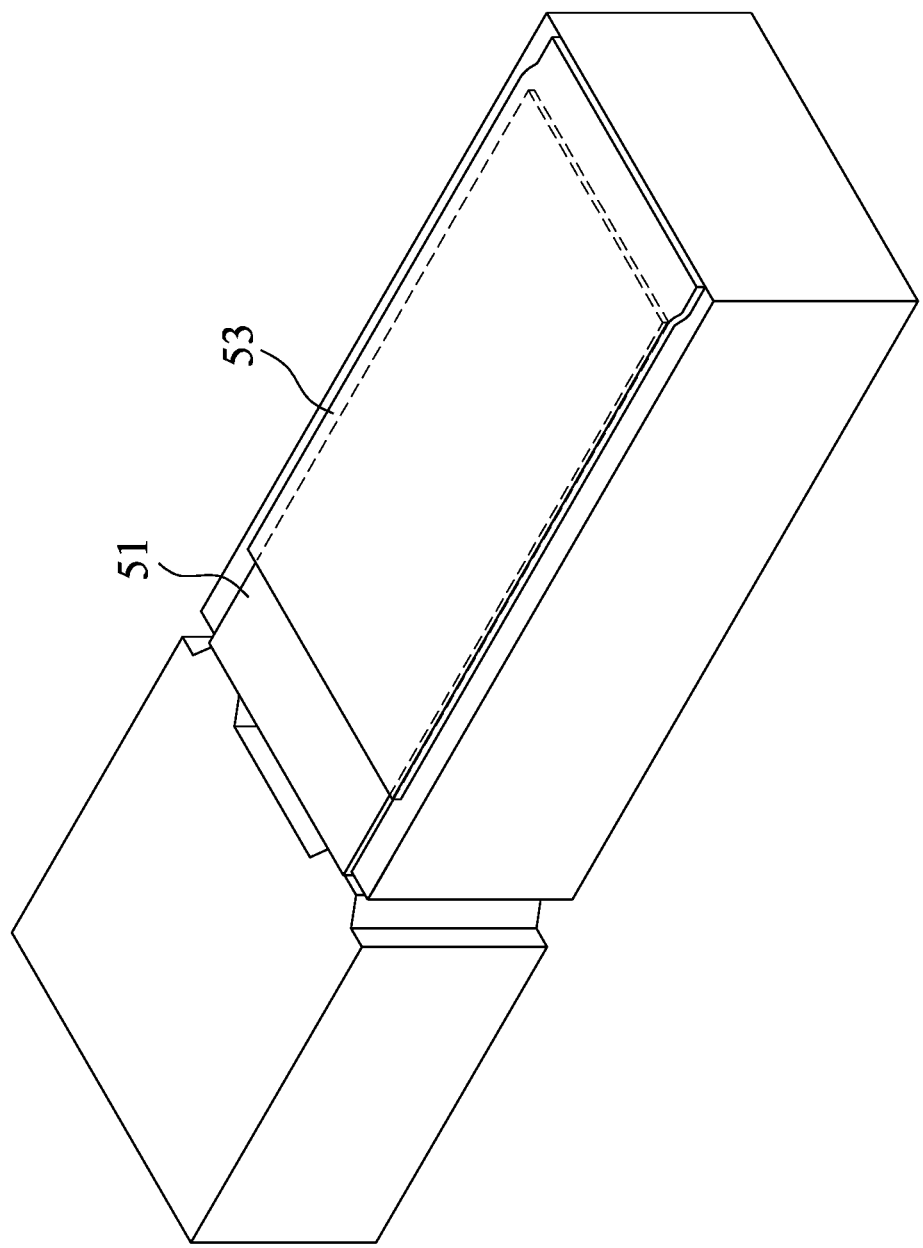
Figure 17C:
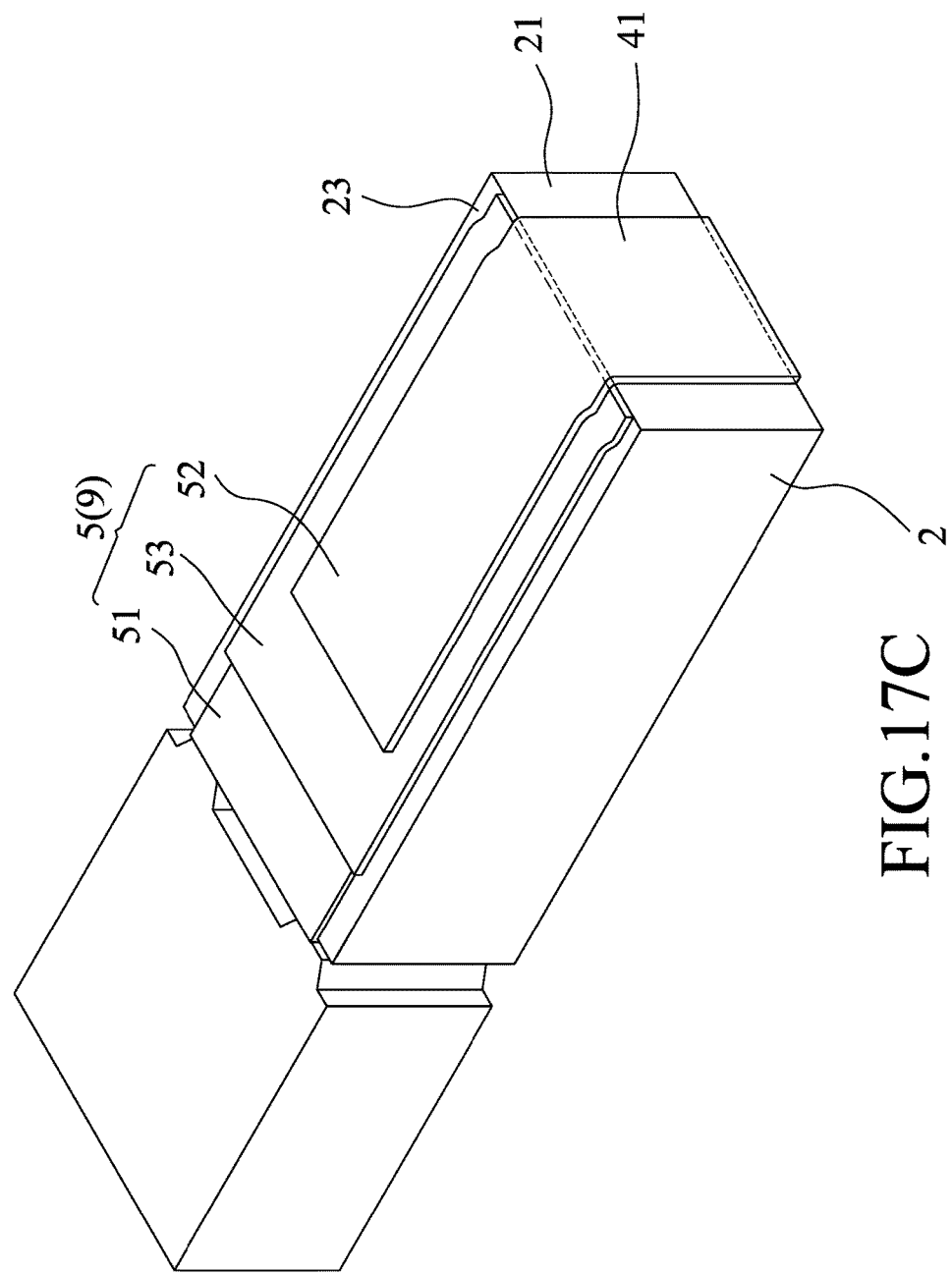

Referring to FIG. 15, the passive chip device 20 may be mounted to two contacting points 851 of a circuit plate 85 through the terminal contacts 41 using a solder 86 by surface-mount techniques.

Referring to FIGS. 4 and 16A to 16C, the method of making the passive chip device of the second embodiment differs from the method of making the first embodiment in that each of the terminal contacts 41 further extends from a respective one of the end faces 21 to the second surface 23 of the chip body 2.

Referring to FIGS. 5 and 17A to 17C, the method of making the passive chip device of the third embodiment differs from the method of making the first embodiment in that the functional layered structure 9 is in the form of the capacitor 5 and is formed by forming a first conductive layer 51 on the second surface 23 of the chip body 2 and a respective one of the end faces 21, forming a dielectric layer 53 on the first conductive layer 51, and forming a second conductive layer 52 on the dielectric layer 53 and the other respective one of the end faces 21 so that the dielectric layer 53 is sandwiched between and electrically isolates the first and second conductive layers 51, 52.

To sum up, the method of the present disclosure may be advantageous over the prior art in reducing the steps of making the passive chip device.

In addition, the chip body 2 of the passive chip device of the present disclosure is in the form of a single piece. As such, the chip body 2 of the passive chip device of the present disclosure has a higher mechanical strength than that of the conventional multilayered type inductor.

Furthermore, formation of the first and second segments 411, 412 of the terminal contacts 41 is performed in one single step. Hence, the method of the present disclosure may alleviate the aforesaid drawback regarding the requirement of numerous steps in making the terminal contacts in the conventional method of making the thin film type inductors.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of making a surface-mountable passive chip device, comprising:
    forming a patterned wafer which has a peripheral end portion and at least one passive-component unit that includes a connecting portion, a breaking line, and a plurality of spaced apart chip bodies, the connecting portion being connected to the peripheral end portion, the breaking line having a plurality of connecting tabs that are spaced apart from one another, each of the connecting tabs being disposed between and interconnecting the connecting portion and a respective one of the chip bodies, each of the chip bodies extending in an axial direction and having two opposite end faces and a first surface, the end faces being opposite to each other in the axial direction, the first surface extending along the axial direction between the end faces;
    forming a functional layered structure on each of the chip bodies;
    forming a conductive seed layer on the functional layered structure on each of the chip bodies;
    forming a contact-defining patterned photoresist layer on the conductive seed layer on each of the chip bodies, such that two opposite end portions of the conductive seed layer, which are respectively disposed adjacent to the end faces of the each chip body, are exposed from the contact-defining patterned photoresist layer;
    forming a surface-mount contact unit having two spaced apart conductive terminal contacts that are respectively formed on the end portions of the conductive seed layer on each of the chip bodies, each of the conductive terminal contacts being electro-connected to the functional layered structure and extending from a respective one of the end faces to the first surface;
    removing the contact-defining patterned photoresist layer and the remaining portion of the seed layer that is covered by the contact-defining patterned photoresist layer; and
    breaking the patterned wafer along the breaking line by applying an external force thereto so as to form a plurality of passive chip devices.

2. The method of claim 1, wherein each of the chip bodies further includes a second surface which is opposite to the first surface and which extends along the axial direction, each of the terminal contacts further extending from a respective one of the end faces to the second surface.

3. The method of claim 1, wherein each of the terminal contacts is made from a material containing Ni and a metal selected from the group consisting of Au and Sn.

4. The method of claim 1, wherein each of the connecting tabs is reduced in width from the connecting portion toward the respective one of the chip bodies, each of the connecting tabs having a thickness less than that of the connecting portion and that of the chip bodies.

5. The method of claim 1, wherein the forming of the functional layered structure includes:
    forming a layered structure-defining seed layer on each of the chip bodies;
    forming a layered structure-defining patterned photoresist layer on the layered structure-defining seed layer, such that a region of the layered structure-defining seed layer is exposed from the layered structure-defining patterned photoresist layer; and plating a metal on the exposed region of the layered structure-defining seed layer so as to form the functional layered structure, the functional layered structure being in the form of a coil surrounding the respective one of the chip bodies for generating inductance and having two opposite end portions, each of the terminal contacts contacting a respective one of the end portions of the coil.

6. The method of claim 5, wherein the conductive seed layer and the seed layer are made from a catalytically active material selected from the group consisting of Pt, Pd, Au, Ag and Cu, or a conductive material, and when the conductive seed layer and the seed layer are made from the catalytically active material, the terminal contacts and the metal layer are formed through chemical plating techniques, and when the conductive seed layer and the layered structure-defining seed layer are made from the conductive material, the terminal contacts and the metal layer are formed through electro-plating techniques.

7. The method of claim 5, wherein the forming of the functional layered structure further includes:
    removing the layered structure-defining patterned photoresist layer and a portion of the layered structure-defining seed layer that is covered with the layered structure-defining patterned photoresist layer from each of the chip bodies.

8. The method of claim 2, wherein the functional layered structure is in the form of the capacitor and includes first and second conductive layers formed on the second surface, and a dielectric layer that is sandwiched between the first and second conductive layers.

9. The method of claim 1, wherein each of the chip bodies is made from a magnetic material or a non-magnetic material, the magnetic material being selected from magnetic metal or magnetic ceramic, the non-magnetic material being selected from a Si-based material or metal.

10. The method of claim 9, further comprising a step of:
forming an insulator layer on each of the chip bodies before formation of the functional layered structure when each chip body is made from the magnetic metal or non-magnetic metal.

* * * * *